United States Patent
Kudo et al.

(10) Patent No.: US 12,218,068 B2
(45) Date of Patent: Feb. 4, 2025

(54) THROUGH ELECTRODE SUBSTRATE, ELECTRONIC UNIT, METHOD FOR MANUFACTURING THROUGH ELECTRODE SUBSTRATE, AND METHOD FOR MANUFACTURING ELECTRONIC UNIT

(71) Applicant: DAI NIPPON PRINTING CO., LTD., Tokyo (JP)

(72) Inventors: Hiroshi Kudo, Tokyo (JP); Miyuki Suzuki, Tokyo (JP); Shohei Yamada, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 515 days.

(21) Appl. No.: 17/601,960

(22) PCT Filed: Apr. 15, 2020

(86) PCT No.: PCT/JP2020/016515
§ 371 (c)(1),
(2) Date: Oct. 7, 2021

(87) PCT Pub. No.: WO2020/213624
PCT Pub. Date: Oct. 22, 2020

(65) Prior Publication Data
US 2022/0148973 A1    May 12, 2022

(30) Foreign Application Priority Data
Apr. 15, 2019   (JP) ................................ 2019-077292

(51) Int. Cl.
*H01L 23/538*   (2006.01)
*H01L 21/48*   (2006.01)
*H01L 23/12*   (2006.01)

(52) U.S. Cl.
CPC ........ *H01L 23/5384* (2013.01); *H01L 21/486* (2013.01); *H01L 23/12* (2013.01); *H01L 23/5386* (2013.01)

(58) Field of Classification Search
CPC ... H01L 23/5384; H01L 21/486; H01L 23/12; H01L 23/5386; H01L 23/49816;
(Continued)

(56) References Cited

U.S. PATENT DOCUMENTS

2008/0119041 A1   5/2008  Magera et al.
2015/0311154 A1*  10/2015 Sunohara .......... H01L 23/49894
                                                       257/774
2016/0330836 A1*  11/2016 Mizutani ................ H05K 3/423

FOREIGN PATENT DOCUMENTS

JP       2004-311919 A    11/2004
JP       2008-227433 A     9/2008
(Continued)

OTHER PUBLICATIONS

International Preliminary Report issued on Sep. 28, 2021 for the corresponding PCT Application No. PCT/JP2020/016515, with English translation.
(Continued)

*Primary Examiner* — Douglas W Owens
(74) *Attorney, Agent, or Firm* — Michael Best & Friedrich LLP

(57) ABSTRACT

A through electrode substrate according to an embodiment of the present disclosure includes a substrate having a first surface, a second surface, and a through-hole that penetrates between the first surface and the second surface and a through electrode disposed inside of the through-hole. The through electrode includes a first portion that closes part of the through-hole adjacent to the first surface and a second portion disposed along the internal surface of the through-hole. The thinnest part of the first portion in a direction
(Continued)

perpendicular to the first surface has a thickness of A, the thinnest part of the second portion has a thickness of B, and the diameter of the through-hole on the first surface has a length of C. The relationship $A<C<A+B\times 2$ is satisfied.

20 Claims, 32 Drawing Sheets

(58) Field of Classification Search
CPC ................ H01L 23/5385; H01L 23/15; H01L 23/49827; H05K 1/02; H05K 1/11; H05K 3/40; H05K 1/115; H05K 3/422
See application file for complete search history.

(56) References Cited

FOREIGN PATENT DOCUMENTS

| JP | 2015-106655 | A | 6/2015 |
|---|---|---|---|
| JP | 2016-213296 | A | 12/2016 |
| JP | 2017-098402 | A | 6/2017 |
| JP | 2018-125349 | A | 8/2018 |
| JP | 2018-163986 | A | 10/2018 |
| TW | 201251554 | A | 12/2012 |
| WO | 2011/127041 | A1 | 10/2011 |
| WO | 2017/209296 | A1 | 6/2018 |

OTHER PUBLICATIONS

Taiwanese Office Action dated Mar. 2, 2023 for the corresponding Taiwanese Application Patent No. 109112628, with English machine translation.

Korean Office Action dated May 1, 2023, for the corresponding Korean Patent Application No. 2021-7036704, with English machine translation.

English translation of International Search Report mailed on Jul. 14, 2020 for the corresponding PCT Application No. PCT/JP2020/016515.

\* cited by examiner

THROUGH ELECTRODE SUBSTRATE, ELECTRONIC UNIT, METHOD FOR MANUFACTURING THROUGH ELECTRODE SUBSTRATE, AND METHOD FOR MANUFACTURING ELECTRONIC UNIT

CROSS-REFERENCE TO RELATED APPLICATIONS

This application is entering into the national phase of PCT Application No. PCT/JP2020/016515, filed on Apr. 15, 2020. Further, this application claims the benefit of priority from Japanese Application Number 2019-077292, filed on Apr. 15, 2019, the entire contents of which are incorporated herein by reference.

BACKGROUND

Technical Field

The present disclosure relates to a through electrode substrate.

Background Art

In recent years, three-dimensional packaging technology has been used in which semiconductor circuit boards having integrated circuits are stacked on top of one another. In the packaging technology, a substrate with through electrodes is used. Such a substrate is also called an interposer. The through electrode is formed by placing an electrical conductor in a through-hole formed in a substrate. As a circuit to be packaged is more highly integrated, the through electrode substrate is also required to be more highly integrated. For example, a technology has been developed that efficiently connects a wiring portion to the through electrodes by placing the wiring portion such that the wiring portion overlaps a portion in which the through-hole is formed.

Through electrodes include a conformal electrode (a conformal via), which is formed with a conductor that does not fill the inside of a through-hole, and a filled electrode (a filled via), which is formed with a conductor that fills the inside of the through-hole. In the case of a conformal via, an electrode to fill the inside of the through-hole is not present, resulting in a reduction of the manufacturing cost and the stress caused by the through electrode. However, since the wiring portion cannot be placed so as to overlap a portion where the through-hole is formed, it is difficult to design a highly integrated through electrode substrate. PTL 1 discloses a technology that places a conductor such that the conductor closes an end of a through-hole adjacent to the surface of a substrate, even for a conformal via. In this manner, a highly integrated through electrode substrate is easily designed by efficiently placing the wiring portion on at least one surface of the substrate.

CITATION LIST

Patent Literature

PTL 1: International Publication No. 2017/209296
PTL 2: Japanese Unexamined Patent Application Publication No. 2008-227433
PTL 3: International Publication No. 2011/127041

SUMMARY

According to PTL 1, a highly integrated through electrode substrate can be achieved. However, higher strength may be required for the through electrode in a portion where the wiring portion is connected to the through electrode.

An objective of an embodiment of the present disclosure is to increase the strength of a through electrode of a through electrode substrate.

According to an embodiment of the present disclosure, a through electrode substrate is provided. The through electrode substrate includes a substrate having a first surface, a second surface, and a through-hole that penetrates between the first surface and the second surface and a through electrode disposed inside of the through-hole. The through electrode includes a first portion that closes part of the through-hole adjacent to the first surface and a second portion disposed along the internal surface of the through-hole. The thinnest part of the first portion in a direction perpendicular to the first surface has a thickness of A, the thinnest part of the second portion has a thickness of B, and the diameter of the through-hole on the first surface has a length of C. The relationship $A<C<A+B\times2$ is satisfied.

The first portion may include a part having a thickness that increases as a distance from the central axis of the through-hole increases.

According to an embodiment of the present disclosure, a through electrode substrate is provided. The through electrode substrate includes a substrate having a first surface, a second surface, and a through-hole that penetrates between the first surface and the second surface and a through electrode disposed inside of the through-hole. The through electrode includes a first portion that closes part of the through-hole adjacent to the first surface and a second portion disposed along the internal surface of the through-hole. The first portion has a part having a thickness in a direction perpendicular to the first surface that increases as a distance from the central axis of the through-hole increases.

When viewed in a cross section including the central axis of the through-hole, a surface of the first portion located inside the through-hole may have the largest curvature at the thinnest part of the first portion.

The thinnest part of the first portion may be located at a position corresponding to the central axis of the through-hole.

The through-hole may have a minimum portion in which the diameter of the through-hole has the smallest value. The minimum portion may be located between the first surface and the second surface, and the through electrode need not close the through-hole at the minimum portion.

The through electrode substrate may further include a wiring layer disposed adjacent to the first surface of the substrate so as to be in contact with the through electrode. When viewed in the direction perpendicular to the first surface, a contact region in which the wiring layer is in contact with the through electrode may overlap the through-hole.

When viewed in the direction perpendicular to the first surface, the contact region may be surrounded by the outer edge of the through-hole on the first surface.

When viewed in the direction perpendicular to the first surface, the contact region may overlap the outer edge of the through-hole on the first surface.

The contact region may include a plurality of regions.

A surface of the first portion adjacent to the first surface may be located inside the through-hole.

The through electrode substrate may further include a filler located inside the through-hole, and the filler may be positioned in a portion of the through electrode other than a metal layer.

The filler may contain a material having electrical conductivity.

The through electrode substrate may further include a second wiring layer disposed adjacent to the second surface of the substrate so as to be in contact with the filler. When viewed in a direction perpendicular to the second surface, a contact region in which the second wiring layer is in contact with the filler may be surrounded by the outer edge of the through-hole on the second surface.

The filler may contain a material having electrical insulating properties.

When viewed in a cross section including the central axis of the through-hole, a surface of the first portion located inside the through-hole may have a radius of curvature ra at the thinnest part of the first portion. The radius of the through-hole on the first surface may have a length of rb, and the relationship ra/rb≥0.2 may be satisfied.

According to an embodiment of the present disclosure, an electronic unit is provided. The electronic unit includes the through electrode substrate described above and an electronic device electrically connected to the through electrode of the through electrode substrate.

The electronic device may include an electrode electrically connected to the through electrode. When viewed in the direction perpendicular to the first surface of the through electrode substrate, the electrode of the electronic device may overlap the through electrode.

According to an embodiment of the present disclosure, a method for manufacturing a through electrode substrate is provided. The method includes forming, in a substrate having a first surface to a second surface and a through-hole that penetrates between the first surface and the second surface, a seed layer extending along the internal surface of the through-hole, forming an electroplated layer on the seed layer under a first electroplating condition so that the electroplated layer has a thickness that does not close the through-hole, and further forming the electroplated layer under a second electroplating condition that the growth rate of the electroplated layer on the first surface is higher than the growth rate of the electroplated layer on the second surface so that part of the through-hole adjacent to the first surface is closed.

A filler with which the inside of the through-hole other than the electroplated layer is filled may be formed by pouring a fluid into the inside of the through-hole from the second surface side and solidifying the fluid.

According to an embodiment of the present disclosure, a method for manufacturing the above-described electronic unit is provided. The method for manufacturing the electronic unit may include electrically connecting the through electrode to the electrode by heating the electronic device with pressure directed to the through electrode substrate being applied to the electronic device.

According to an embodiment of the present disclosure, the strength of the through electrode of the through electrode substrate can be increased.

DETAILED DESCRIPTION

Figure 1:
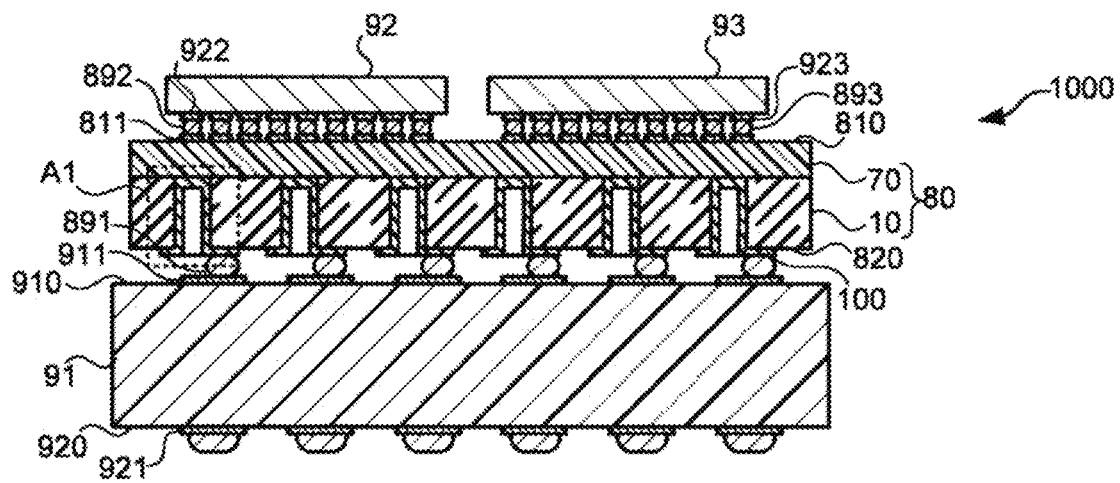
FIG. 1 illustrates a sectional structure of an electronic unit according to a first embodiment of the present disclosure.

An electronic unit including a through electrode substrate according to an embodiment of the present disclosure is described in detail below with reference to the accompanying drawings. It should be noted that each of the embodiments described below is an example of an embodiment of the present invention, and the present invention shall not be construed as being limited to the embodiments set forth herein. In the drawings referred to in the present embodiment, the same or similar reference signs (reference numbers suffixed with A, B and so on) are used for the same parts or parts having similar functions, and their description may not be repeated. In addition, the dimensional proportions in the drawings may differ from the actual proportions for convenience of description, and some of the configurations may be removed from the drawings. Furthermore, the terms as used herein to identify the shape, the geometric conditions, or their degree, such as "circle" and "orthogonal," and the numerical values of, for example, a length and angle are not used in a strict sense, and shall be interpreted to include the extent to which similar functions can be expected, without being bound by the strict meaning.

First Embodiment

[1. Configuration of Semiconductor Substrate]

FIG. 1 illustrates a sectional structure of an electronic unit according to the first embodiment of the present disclosure. An electronic unit 1000 includes a wiring substrate 80, a printed wiring board 91, and electronic devices 92, 93. The wiring substrate 80 includes a through electrode substrate 10 and a wiring structure portion 50. The electronic devices 92, 93 are connected to the printed wiring board 91 via the wiring substrate 80. The wiring substrate 80 is an example of an interposer. The wiring substrate 80 includes the through electrode substrate 10 and a wiring laminate 70. In the through electrode substrate 10, through electrodes 100 that penetrate the substrate are disposed. The configuration is described in detail below. In the wiring laminate 70, stacked copper interconnection wires are formed. An electrode 811 disposed on a first surface 810 of the wiring substrate 80 and a through electrode 100 exposed at a second surface 820 of the wiring substrate 80 are connected to each other by an interconnection wire disposed in the wiring laminate 70.

In this example, the printed wiring board 91 is a substrate containing a resin, such as glass epoxy. The printed wiring board 91 is a substrate on which a copper interconnection wire is formed using a copper clad laminate. In this example, an electrode 911 disposed on a first surface 910 of the printed wiring board 91 and an electrode 921 disposed on a second surface 920 of the printed wiring board 91 are connected to each other by an internal copper connection wire. By connecting the electrode 911 to the through electrode 100 using a bump 891, the printed wiring board 91 and the wiring substrate 80 are electrically connected to each other.

The electronic devices 92, 93 include elements formed by semiconductors, such as silicon. For example, the electronic devices 92, 93 are CPUs, memories, FPGAs, sensors, or the like. The electronic devices may be configured as a laminated body of a plurality of semiconductor substrates. For example, in the case of a memory, the electronic device may have a structure that is a combination of a memory controller and a memory laminated body, such as an HBM (High Bandwidth Memory).

In this example, an electrode 922 of the electronic device 92 and the electrode 811 of the wiring substrate 80 are connected to each other via a bump 892. In this manner, the electronic device 92 is electrically connected to the wiring substrate 80. An electrode 923 of the electronic device 93 and the electrode 811 of the wiring substrate 80 are electrically connected to each other via a bump 893. In this manner, the electronic device 93 is electrically connected to the wiring substrate 80. In addition, the electronic device 92 and the electronic device 93 is electrically connected to each other via the wiring substrate 80.

[2. Structure of Through Electrode Substrate]

The through electrode substrate 10 and the through electrode 100 disposed in the through electrode substrate 10 are described below.

Figure 2:
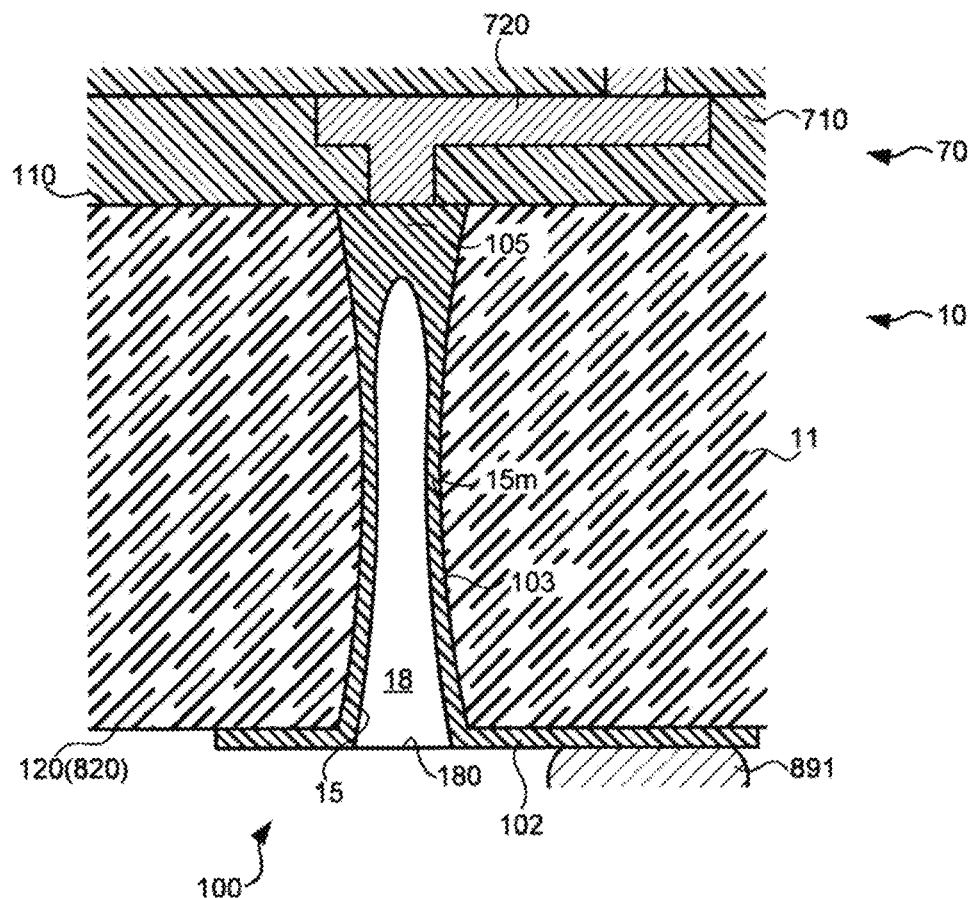
FIG. 2 illustrates a sectional structure of a through electrode substrate according to the first embodiment of the present disclosure.

FIG. 2 illustrates a sectional structure of the through electrode substrate according to the first embodiment of the present disclosure. FIG. 2 is an enlarged view of a region A1 illustrated in FIG. 1. The through electrode substrate 10 includes a glass substrate 11 and the through electrodes 100. The glass substrate 11 has a first surface 110 and a second surface 120. The wiring laminate 70 connected to the through electrode 100 is disposed adjacent to the first surface 110 of the glass substrate 11. The wiring laminate 70 includes an insulating interlayer 710 and a wiring layer 720. The insulating interlayer 710 may be made of an organic material, such as polyimide or acrylic, or an inorganic material, such as silicon oxide. The wiring layer 720 is formed by using a semi-additive technique, a dual damascene technique, or the like.

The glass substrate 11 has a through-hole 15 that penetrates between the first surface 110 and the second surface 120. The diameter of the through-hole 15 has a minimum value of dcm at a minimum portion 15m. In this example, the minimum portion 15m is located between the first surface 110 and the second surface 120. In this example, the outline of the through-hole 15 as viewed in a direction perpendicular to the first surface 110 is a circle. The diameter of the through-hole 15 corresponds to the diameter of the circle. Note that the outline of the through-hole 15 may have a shape other than a circle. In this case, the diameter of the through-hole 15 is the dimension of the through-hole 15 in a direction in which a plurality of through-holes 15 are aligned.

The through electrode 100 is disposed inside the through-hole 15 so that an element on the first surface 110 is electrically connected with an element on the second surface 120 through the through-hole 15. The through electrode 100 includes a pad portion 102, a through portion 103, and a closure portion 105. The closure portion 105 is an electric conductor that closes part of the through-hole 15 adjacent to the first surface 110. The closure portion 105 is also referred to as a "first portion". A surface of the closure portion 105 ("Bs" in FIG. 3) located inside the through-hole 15 is closer to the first surface 110 than the minimum portion 15m is. That is, the minimum portion 15m is not closed by the closure portion 105.

The through portion 103 is an electrical conductor disposed along the internal surface of the through-hole 15. The through portion 103 extends continuously from the closure portion 105 to the second surface 120 of the through-hole 15. The through portion 103 is also referred to as a "second portion". The through portion 103 is disposed so as not to close a region (including the minimum portion 15m) inside the through-hole 15 other than the closure portion 105. Thus, a space 18 surrounded by the through electrode 100 inside the through-hole 15 communicates with the space on the second surface 120 of the glass substrate 11 through an opening 180. As described in another embodiment below, the inside of the space 18 may be filled with another conductor or an insulator.

The pad portion 102 extends on the second surface 120 of the glass substrate 11 continuously from the through portion 103. The bump 891 is disposed on the pad portion 102.

[3. Structure of Closure Portion]

The structure of the closure portion 105 is described in detail below with reference to FIG. 3.

Figure 3:
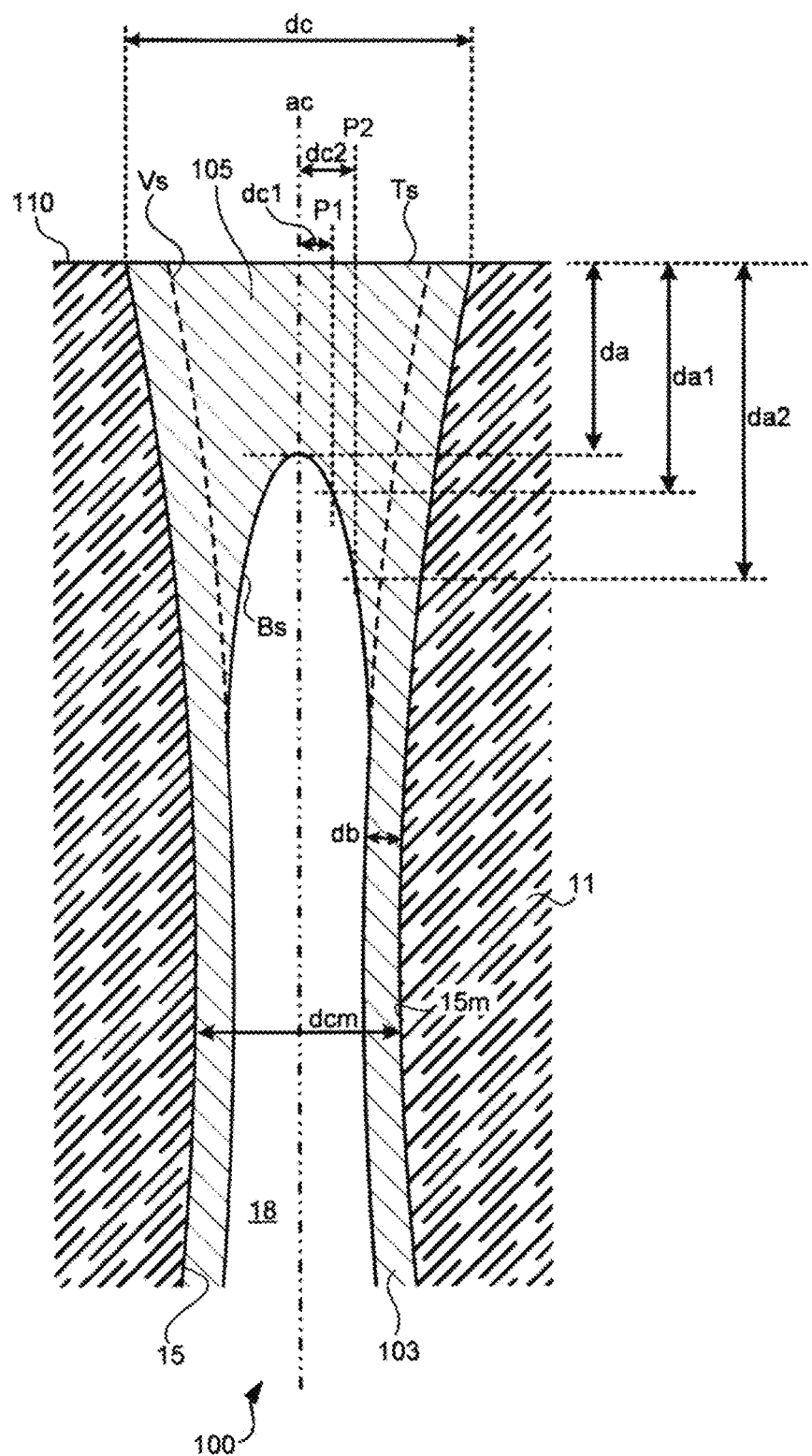
FIG. 3 illustrates a structure (a closure portion) of a through electrode adjacent to a first surface according to the first embodiment of the present disclosure.

FIG. 3 illustrates the structure (the closure portion) of a through electrode adjacent to the first surface according to the first embodiment of the present disclosure. FIG. 3 is an enlarged view of the closure portion 105 and its vicinity illustrated in FIG. 2. Each of the portions is first defined using FIG. 3. Let Ts be the surface of the closure portion 105 adjacent to the first surface 110. In this example, the surface Ts is almost flush with the first surface 110 of the glass substrate 11. The wiring layer 720 illustrated in FIG. 2 is in contact with the surface Ts. In this example, as illustrated in FIG. 2, the contact region where the wiring layer 720 is in contact with the surface Ts is surrounded by the outer edge of the through-hole 15 on the first surface 110 when viewed in the direction perpendicular to the first surface 110. Although not illustrated, the contact region need not be surrounded by the outer edge of the through-hole 15 though the contact region overlaps the through-hole 15. The contact region is defined as a region of an opening formed in the insulating interlayer 710 so as to extend to the closure portion 105. Note that the surface Ts may be located on the inner side of the through-hole 15 or on the outer side of the through-hole 15 than the first surface 110 of the glass substrate 11.

Let Bs be the surface of the closure portion 105 toward the second surface 120 (located inside of the through-hole 15). Imaginary lines Vs show location of the conductor before the closure portion 105 is formed (in a manufacturing stage illustrated in FIG. 7). A central axis ac corresponds to the center of a circle when the through-hole 15 is viewed in the direction perpendicular to the first surface 110. Let dc be the diameter of the through-hole 15 on the first surface 110. Let dc1 and dc2 be the distances from the central axis ac to positions P1 and P2, respectively, where dc1<dc2.

Let da be the thickness of the thinnest part of the closure portion 105 in the direction perpendicular to the first surface 110 (hereinafter simply referred to as the "thickness of the closure portion 105"). In this example, the thinnest part of the closure portion 105 is located at a position corresponding to the central axis ac. Therefore, da can also be said to be the thickness of the closure portion 105 at the central axis ac. A symbol da1 stands for the thickness of the closure portion 105 at a position at a distance of dc1 from the central axis ac in the in-plane direction of the first surface 110. A symbol da1 stands for the thickness of the closure portion 105 at a position at a distance of dc2 from the central axis ac in the in-plane direction of the first surface 110. The thickness db corresponds to the thickness of the thinnest part of the through electrode 100 inside the through-hole 15. That is, db corresponds to the thickness of the thinnest part of the through portion 103.

The position of the thinnest part of the through portion 103 in the direction perpendicular to the first surface 110 is not limited to a particular position. For example, the thinnest part of the through portion 103 may be located at the minimum portion 15m, may be located at a position closer to the first surface 110 than the minimum portion 15m, or may be located at a position closer to the second surface 120 than the minimum portion 15m.

The structure of the closure portion 105 is determined such that the following relationships R1 to R3 are satisfied:

R1: da<dc<da+db×2

R2: The closure portion 105 includes a part having a thickness that gradually increases as a distance from the central axis ac increases (in this example, da<da1<da2, and a change in thickness is continuous).

R3: When viewed in a cross section including the central axis ac, the thinnest part of the closure portion 105 has a curvature of the surface Bs greater than the other parts.

In the example illustrated in FIG. 3, da<da1<da2. Accordingly, the thickness change specified in the relationship R2 continuously occurs. The relationship R3 can be rephrased as "the surface Bs has the greatest curvature at the thinnest part of the closure portion 105 when viewed in a cross section including the central axis ac."

Here, by using the through electrode 100 of a conformal type, that is, by forming the through electrode 100 such that the space 18 is disposed inside the through-hole 15, the manufacturing cost can be reduced and, in addition, the stress can be reduced. Furthermore, since the through electrode 100 has a closure portion 105, the surface Ts of the through electrode 100 can electrically be connected to the wiring layer 720 at a position that overlaps the through-hole 15.

In the example illustrated in FIG. 3, the structure of the closure portion 105 satisfies all of the conditions, that is, the relationships R1 to R3. However, the structure may be a structure that satisfies only one of the conditions or a structure that satisfies a combination of any two of the conditions (that is, a structure that does not satisfy any one of the three conditions). In addition, in the relationship R2, a change in thickness (from the thickness at the central axis ac to the thickness at the position P2 via the thickness at the position P1) is not limited to a change that is continuous throughout the region. It is only required that the change is continuous in only part of the region. By satisfying at least one of the conditions (the relationships R1 to R3), the closure portion 105 can have a strong retention force against a force directed from the surface Ts to the interior of the through-hole 15. In this example, since the through-hole 15 has a structure including the minimum portion 15m, the closure portion 105 has a stronger retention force against a force directed from the surface Ts to the interior of the through-hole 15. Accordingly, high stability can be obtained in the connection between the surface Ts and the wiring layer 720. In particular, if the surface Bs of the closure portion 105 has a substantially arch-shaped structure, the closure portion 105 can have an even stronger retention force.

The relationships R1 to R3 are described in detail below.

The condition "da<dc" in the relationship R1 is described below. In the process of connecting the wiring laminate 70, the printed wiring board 91, the electronic device 92, and the like to the through electrode 100 of the through electrode substrate 10, the through electrode substrate 10 is heated. When the through electrode substrate 10 is heated, the through electrode 100 thermally expands. If the coefficient of thermal expansion of the through electrode 100 differs from that of the substrate 11, internal stress due to the thermal expansion is generated in the through electrode 100. The greater the internal stress is, the more likely it is that defects, such as cracking and peeling, may occur. Cracking occurs, for example, in the substrate 11. Peeling occurs, for example, between the closure portion 105 and the substrate 11. If "da<dc" is satisfied, the internal stress generated in the closure portion 105 of the through electrode 100 can easily be reduced by the surface Ts. This makes it possible to inhibit occurrence of defects, such as cracking and peeling. As a result, the closure portion 105 can withstand the force in a direction from the surface Ts to the interior of the through-hole 15.

The condition "dc<da+db×2" in the relationship R1 is described below. When the coefficient of thermal expansion of the through portion 103 of the through electrode 100 differs from that of the substrate 11, the internal stress due to thermal expansion is generated in the through portion 103. The smaller the thickness of the through portion 103 is, the more likely it is that the through portion 103 peels off from the internal surface of the through-hole 15 due to the internal stress. By setting the thickness of the thinnest part of the through portion 103 such that "dc<da+db×2" is satisfied, the through portion 103 can be inhibited from peeling off from the internal surface of the through-hole 15.

As the values of dc, da, and db in the relationship R1, the average values of the measured values of dc, da, and db for a plurality of through-holes 15 and through electrodes 100 are used. For example, the average values of the measured values of dc, da, and db for 50 or more through-holes 15 and through electrodes 100 are used.

Figure 44A:
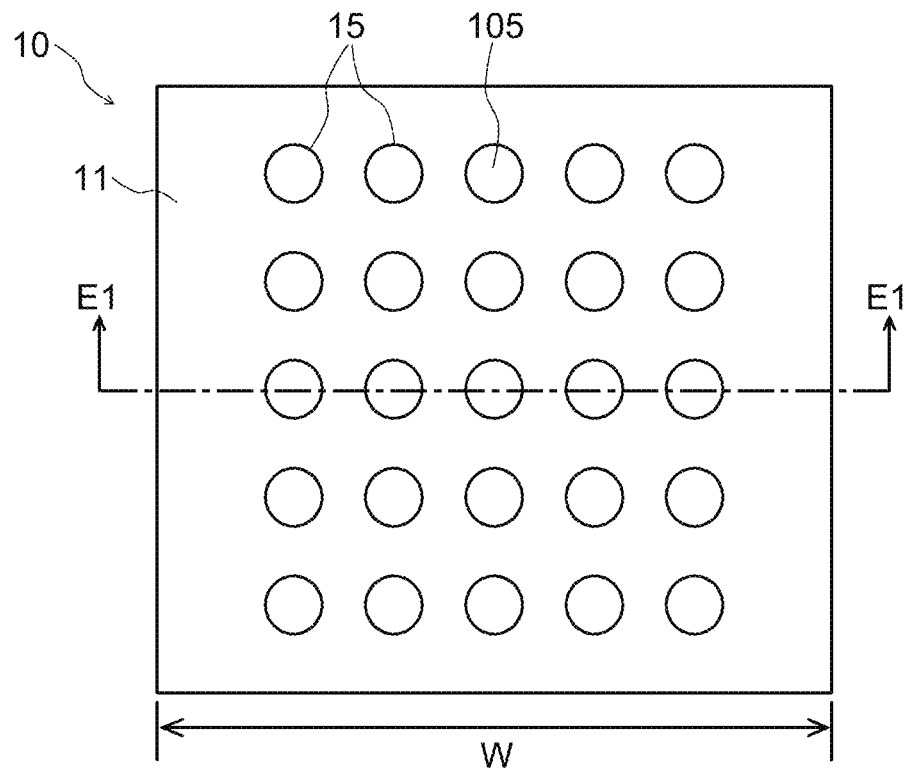
FIG. 44A is a plan view illustrating an example of a sample of a through electrode substrate.

A technique for measuring dc, da, and db is described below. As illustrated in FIG. 44A, a preparation process is first carried out to prepare a sample of the through electrode substrate 10 having a width W. The width W of the sample is, for example, greater than or equal to 500 μm and less than or equal to 1 mm. The sample includes a plurality of, for example, five or more through-holes 15 aligned in the width direction.

Figure 44B:
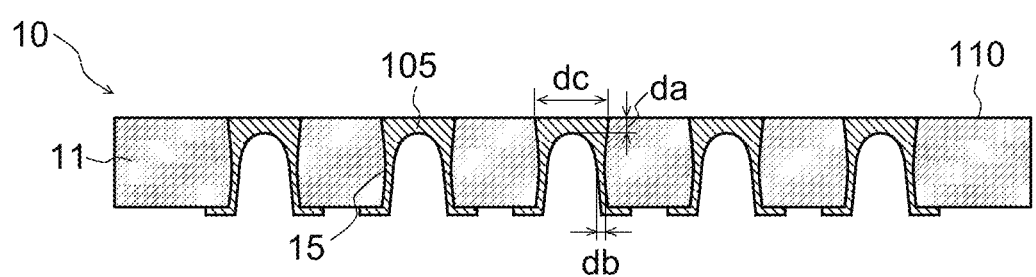
FIG. 44B is a sectional view of the through electrode substrate taken along line E1-E1 of FIG. 44A.

Subsequently, a cutting process is carried out by ion polishing to cut the sample along a cutting-plane line E1-E1 illustrated in FIG. 44A. In the cutting process, the sample is cut such that the cutting-plane line E1-E1 passes through all the through-holes 15 aligned in the width direction. It is desirable that the cutting-plane line E1-E1 pass through the center of the through-hole 15 located in the middle in the width direction. FIG. 44B is a sectional view of the through electrode substrate taken along the line E1-E1 of FIG. 44A.

Subsequently, a selection process is carried out to select the through-hole 15 having the largest diameter dc. In the example illustrated in FIG. 44B, the through-hole 15 located in the middle in the width direction has the largest diameter dc. Thereafter, a measurement process is carried out to measure da and db of the through electrode 100 provided in the through-hole 15 having the largest diameter dc. In this manner, the measured values of dc, da, and db of one through-hole 15 and one through electrode 100 can be obtained. By carrying out the preparation process, cutting process, selection process, and measurement process 50 times, the measured values of dc, da, and db for 50 or more through-holes 15 and through electrodes 100 can be obtained. To measure the dimensions of dc, da, db, and the like, a scanning electron microscope (SEM) available from JEOL Ltd. can be used.

Figure 45A:
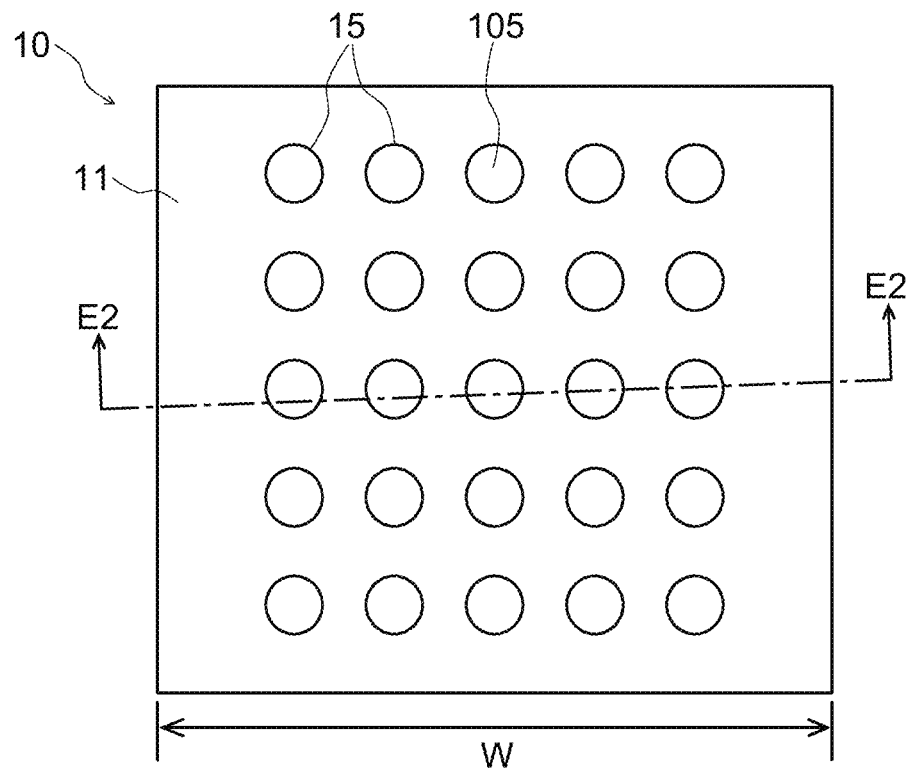
FIG. 45A is a plan view illustrating another example of a sample of a through electrode substrate.
Figure 45B:
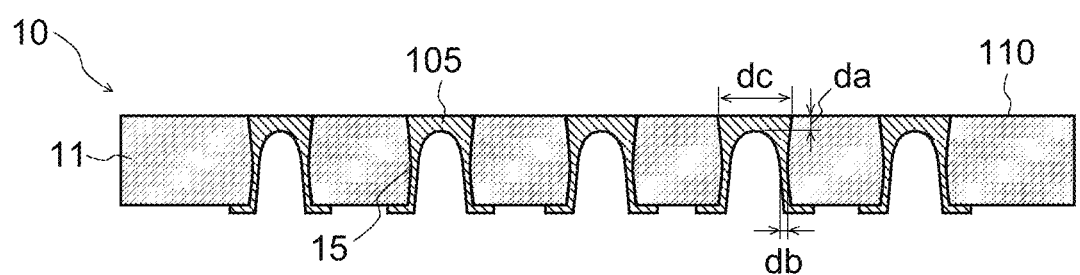
FIG. 45B is a sectional view of the through electrode substrate taken along line E2-E2 of FIG. 45A.

FIG. 45A is a plan view of another example of a sample of the through electrode substrate. As illustrated in FIG. 45A, in the cutting process, the cutting-plane line E2-E2 may not pass through the center of the through-hole 15 located in the middle in the width direction. In this case, as illustrated in FIG. 45B, the diameters dc of the plurality of through-holes 15 appearing in the sectional view differ from one another. FIG. 45B is a sectional view of the through electrode substrate taken along line E2-E2 of FIG. 45A.

Even in the example illustrated in FIG. 45B, the selection process is carried out to select the through-hole 15 having the largest diameter dc in the same manner as in the example illustrated in FIG. 44B. In the example illustrated in FIG. 45B, the second through-hole 15 from the right has the largest diameter dc. Subsequently, the measurement process is carried out to measure da and db of the through electrode 100 provided in the through-hole 15 having the largest diameter dc.

According to the above-described measurement technique, even if the cutting-plane line for the sample deviates from the ideal cutting-plane line in the cutting process, the through-hole 15 to be measured can appropriately be selected. Thus, occurrence of the variation in the measured values of dc, da, and db can be inhibited.

The relationship R2 is described below. In the closure portion 105 that satisfies the relationship R2, the surface Bs located in the interior of the through-hole 15 includes a portion that extends toward the second surface 120 as a distance from the central axis ac increases. Accordingly, the surface Bs of the closure portion 105 can have an arch-shaped structure. In this case, if the closure portion 105 receives a force in a direction from the surface Ts to the interior of the through-hole 15, a compressive force is generated on the surface Bs. Therefore, the closure portion 105 can withstand the force in the direction from the surface Ts to the interior of the through-hole 15.

The relationship R3 is described below. When the surface Bs of the closure portion 105 has an arch-shaped structure, a force generated inside of the closure portion 105 can be dispersed more as a curvature of the surface Bs increases. The force generated inside of the closure portion 105 tends to increase as a distance from the central axis ac decreases. In the closure portion 105 that satisfies the relationship R3, the surface Bs has the greatest curvature at the thinnest part of the closure portion 105. The thinnest part of the closure portion 105 overlaps the central axis ac or is close to the central axis ac. By satisfying the relationship R3, the force generated in the thinnest part of the closure portion 105 can easily be dispersed to the surrounding regions. This inhibits defects, such as cracking, from occurring in the thinnest part of the closure portion 105.

As illustrated in FIG. 3, the thickness db of the thinnest part of the through portion 103 is less than the thickness da of the thinnest part of the closure portion 105. For example, db/da is less than or equal to ¼, and may be less than or equal to ⅕. For example, db/da is greater than or equal to ⅒, and may be greater than or equal to ⅑.

[4. Method for Manufacturing Through Electrode Substrate]

The method for manufacturing the above-described through electrode substrate 10 is described below with reference to FIGS. 4 to 11.

Figure 4:
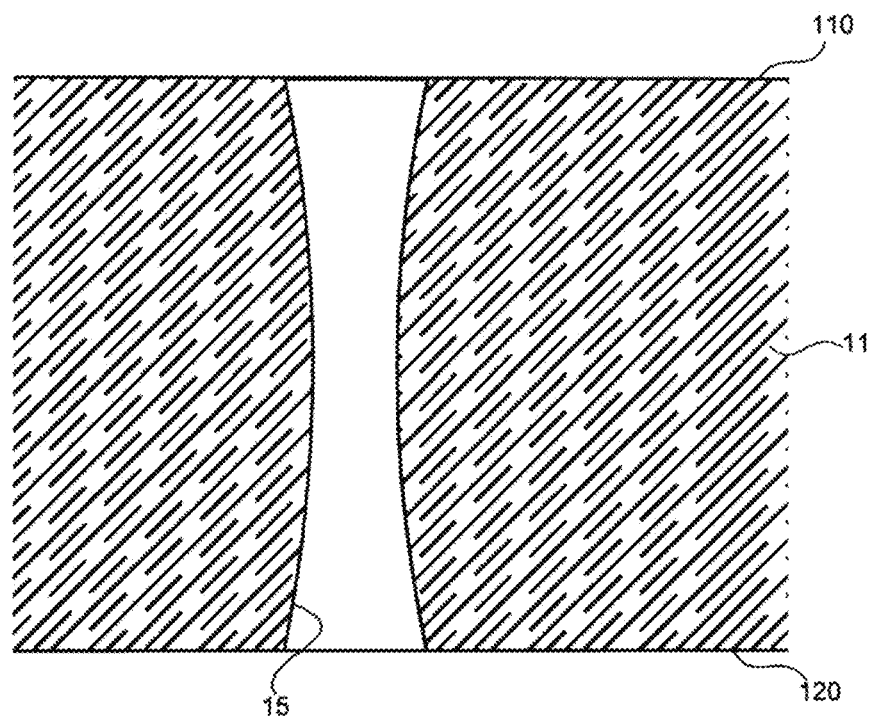
FIG. 4 illustrates a method for manufacturing the through electrode substrate according to the first embodiment of the present disclosure.

FIGS. 4 to 11 illustrate the method for manufacturing the through electrode substrate according to the first embodiment of the present disclosure. As illustrated in FIG. 4, a glass substrate 11 is prepared, and first a through-hole 15 is formed in the glass substrate 11. The thickness of a substrate, such as the glass substrate 11, is greater than or equal to, for example, 100 μm and may be greater than or equal to 200 μm. For example, the thickness of the substrate may be less than or equal to 1 mm, and may be less than or equal to 500 μm. In this example, the thickness of the glass substrate 11 is 400 μm. Instead of using a glass substrate 11, a substrate formed of another inorganic material, such as a quartz substrate, a silicon wafer, or ceramic, may be used. Alternatively, a substrate formed of an organic material, such as a resin substrate, may be used. When a conductive substrate, such as a silicon wafer, is used, the surface of the substrate including the internal surface of the through-hole 15 is covered with an insulator after the through-hole 15 is formed.

After a laser beam is emitted to the glass substrate 11 under predetermined conditions, an etching process is carried out with a predetermined etchant. Thus, the through-hole 15 is formed so as to penetrate between the first surface 110 and the second surface 120. The maximum value of the diameter of the through-hole 15 is, for example, greater than or equal to 25 μm and less than or equal to 50 μm. In this example, the diameter of the through-hole 15 has a minimum value substantially in the middle of the glass substrate 11. The minimum value is, for example, greater than or equal to 10 μm and less than or equal to 30 μm. The minimum value of the diameter of the through-hole 15 may be greater than or equal to 40% and less than or equal to 60% of the maximum value of the diameter of the through-hole 15.

Figure 5:
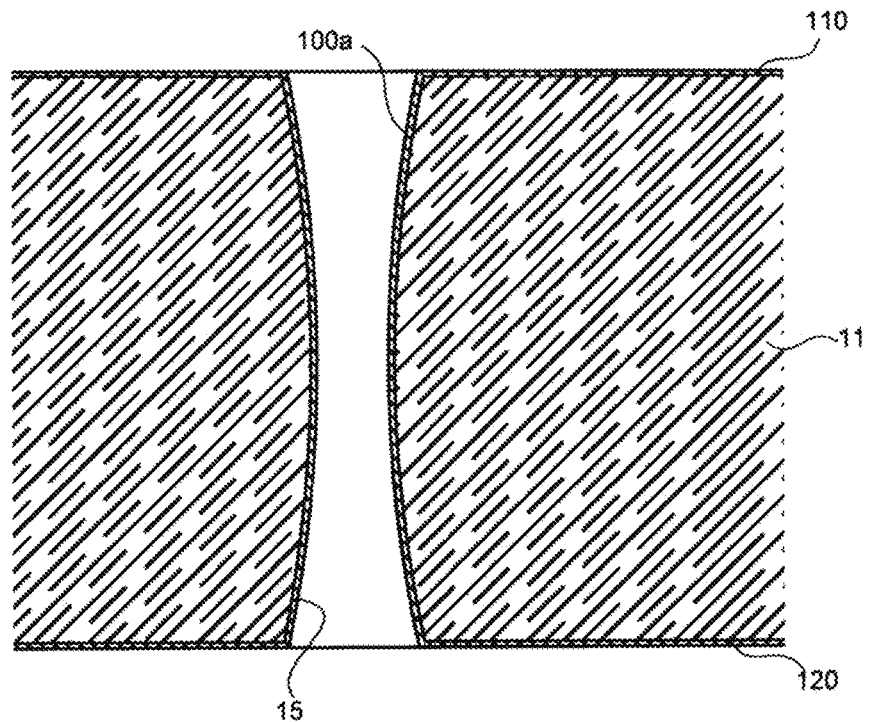
FIG. 5 illustrates the method for manufacturing the through electrode substrate according to the first embodiment of the present disclosure.

Subsequently, as illustrated in FIG. 5, a first metal layer 100a is formed on the first surface 110, the second surface 120, and the internal surface of the through-hole 15 of the glass substrate 11 having the through-hole 15 formed therein. The first metal layer 100a functions as a seed layer in a process of forming a second metal layer 100b by an electroplating process (described below). In this example, the first metal layer 100a is Cu formed by an electroless plating process. It is desirable that the first metal layer 100a be deposited so as to have a thickness greater than or equal to 0.1 μm and less than or equal to 3 μm. In this example, the first metal layer 100a is deposited so as to have a thickness of 0.3 μm. Note that the first metal layer 100a can be formed of any metal that functions as a seed layer for the electroplating process. For example, the first metal layer 100a can be a metal including Ti, Ni, Cr, Ti, W, or the like. Alternatively, the first metal layer 100a can be formed by stacking different types of metals. The method for forming the seed layer is not limited to a method using an electroless plating process, and may be a method using a sputtering technique. Although not illustrated, before the first metal layer 100a is formed, an adhesion layer may be formed on the first surface 110, the second surface 120, and the internal surface of the through-hole 15 of the glass substrate 11. The adhesiveness of the adhesion layer to the glass substrate 11 is higher than that of the first metal layer 100a to the glass substrate 11. An example of the material used for the adhesion layer is a metal oxide, such as zinc oxide.

Figure 6:
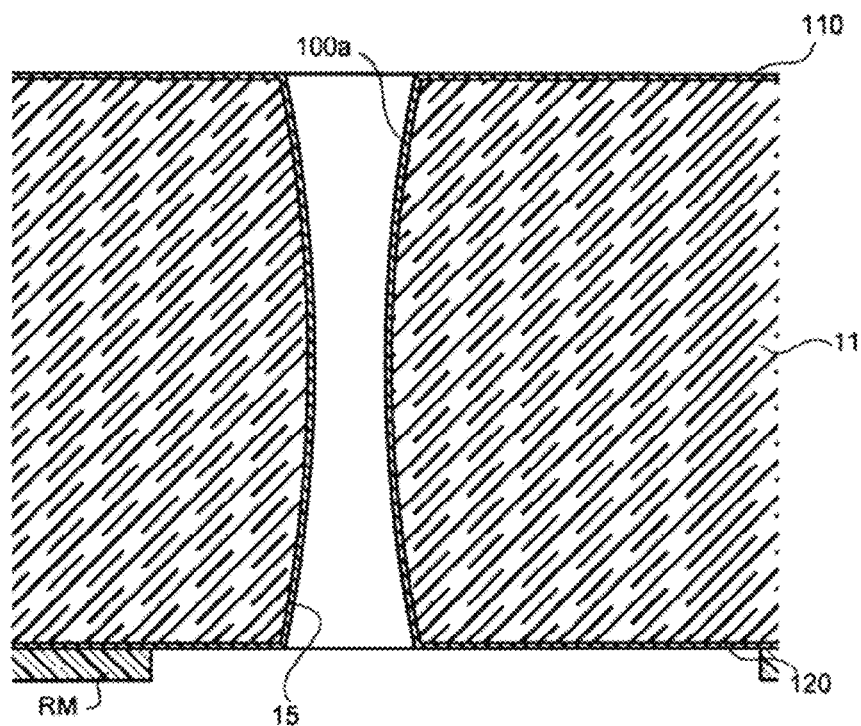
FIG. 6 illustrates the method for manufacturing the through electrode substrate according to the first embodiment of the present disclosure.

Subsequently, as illustrated in FIG. 6, a resist mask RM is formed on a predetermined region of the first metal layer 100a that extends on the second surface 120 of the glass substrate 11. Subsequently, an electroplating process is carried out to grow the second metal layer 100b in the region other than the region having the resist mask RM formed thereon, that is, on the region where the first metal layer 100a is exposed. The electroplating process includes a first electroplating process to form the second metal layer 100b under a first condition and a second electroplating process to form the second metal layer 100b under a second condition that is changed from the first condition.

Figure 7:
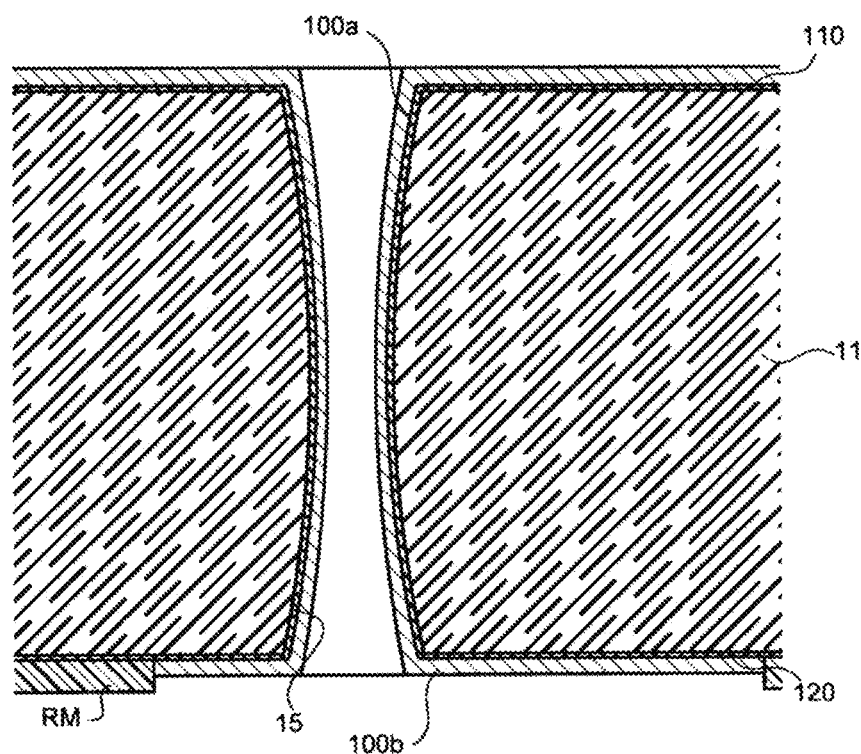
FIG. 7 illustrates the method for manufacturing the through electrode substrate according to the first embodiment of the present disclosure.
Figure 8:
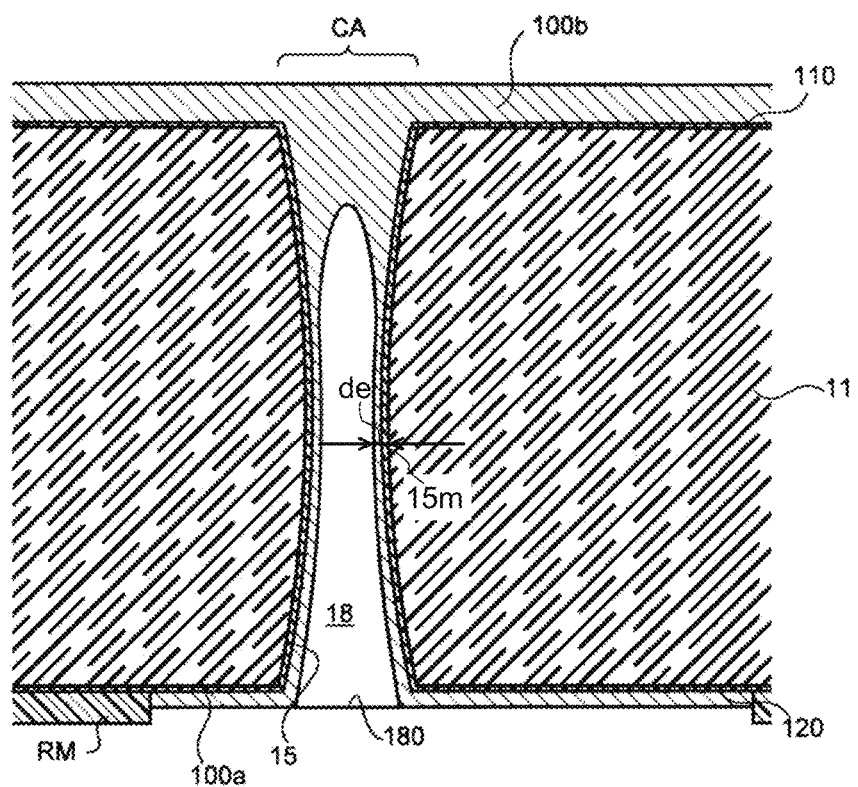
FIG. 8 illustrates the method for manufacturing the through electrode substrate according to the first embodiment of the present disclosure.

FIG. 7 illustrates the first electroplating process. The first condition is set so that the growth rate of the second metal layer 100b on the first surface 110 and that on the second surface 120 are almost the same. FIG. 8 illustrates the second electroplating process. The second condition is set so that the growth rate of the second metal layer 100b on the first surface 110 is higher than that on the second surface 120. For example, the electroplating process can be carried out in an environment where the plating solution is thicker on the first surface 110 than on the second surface 120. Alternatively, the electroplating process may be carried out in an environment where the current supplied to the through-hole 15 is higher on the first surface 110 than on the second surface 120.

Through such a process, a region CA of the through-hole 15 adjacent to the first surface 110 is closed by the second metal layer 100b. In addition, a space 18 surrounded by the second metal layer 100b is formed in the region of the through-hole 15 other than the region CA. In the portion of the through-hole 15 at which the minimum portion 15m is formed, it is desirable that the diameter of the space 18 be greater than or equal to 10% and less than or equal to 50% of the diameter dcm of the through-hole 15 at the minimum portion 15m. That is, it is desirable that a sum thickness de of the first metal layer 100a and the second metal layer 100b at the minimum portion 15m be greater than or equal to 25% and less than or equal to 45% of the diameter dcm. In this example, the first metal layer 100a and the second metal layer 100b are formed so that the thickness de is about 30% of the minimum diameter dcm of the through-hole 15. The space 18 communicates with the space on the second surface 120 of the glass substrate 11 through the opening 180. The second metal layer 100b is, for example, Cu. Note that the second metal layer 100b may be a metal including Au, Ag, Pt, Al, Ni, Cr, Sn, or the like.

Since the through-hole 15 remains open until the through-hole 15 is closed by the closure portion 105, it is also possible to pass the plating solution through the through-hole 15. According to the manufacturing method, the second metal layer 100b can be formed in a stable manner because the closure portion 105 is formed last.

Examples of the first and second electroplating processes are described in detail below with reference to FIGS. 30A to 30D.

The plating solution used in the first electroplating process includes, for example, copper sulfate pentahydrate and sulfuric acid. The molecular formula of copper sulfate pentahydrate is $CuSO_4 \cdot 5H_2O$. The molecular formula of sulfuric acid is $H_2SO_4$. The weight percent of copper sulfate pentahydrate in the plating solution is also referred to as a "first ratio L1". The weight percentage of sulfuric acid in the plating solution is also referred to as a "second ratio L2". In the plating solution used in the first electroplating process, it is desirable that the second ratio L2 be greater than the first ratio L1. This can reduce the difference between the Cu concentration of the plating solution on the first surface 110 or second surface 120 of the glass substrate 11 and the Cu concentration of the plating solution inside the through-hole 15.

Figure 30A:
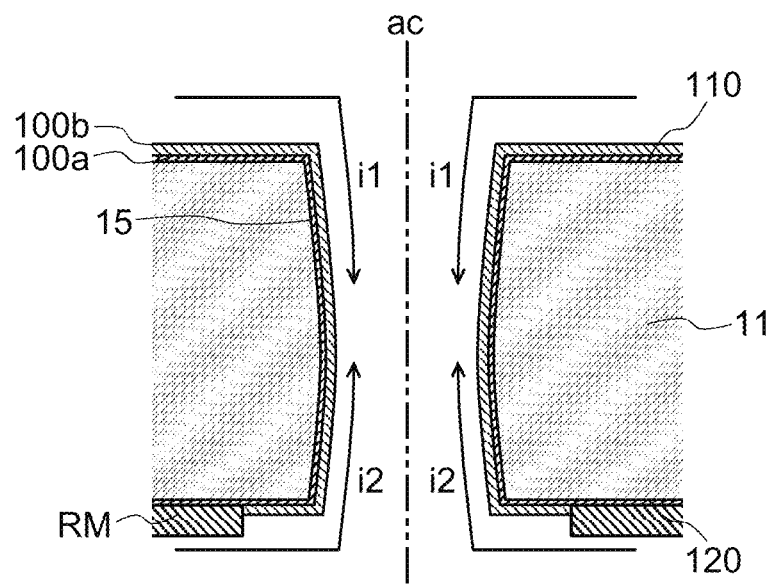
FIG. 30A illustrates an example of a first electroplating process.

FIG. 30A illustrates an example of the first electroplating process. As illustrated in FIG. 30A, a current may be supplied to the through-hole 15 in directions from the first surface 110 and the second surface 120 of the glass substrate 11. The current supplied to the through-hole 15 in a direction from the first surface 110 is also referred to as a "first current i1". The current supplied to the through-hole 15 in a direction from the second surface 120 is also referred to as a "second current i2". In the first electroplating process, it is desirable that the difference between the first current i1 and the second current i2 be small. For example, the first current i1 is greater than or equal to 0.8 times and less than or equal to 1.2 times the second current i2. This inhibits the occurrence of a difference among the growth rate of the second metal layer 100b on the first surface 110, the growth rate of the second metal layer 100b on the second surface 120, and the growth rate of the second metal layer 100b inside the through-hole 15.

As in the first electroplating process, the plating solution used in the second electroplating process may include copper sulfate pentahydrate and sulfuric acid. In the plating solution of the second electroplating process, it is desirable that the first ratio L1 be greater than the second ratio L2. This allows the Cu concentration of the plating solution on the first surface 110 or the second surface 120 of the glass substrate 11 to be higher than that of the plating solution inside the through-hole 15.

Figure 30B:
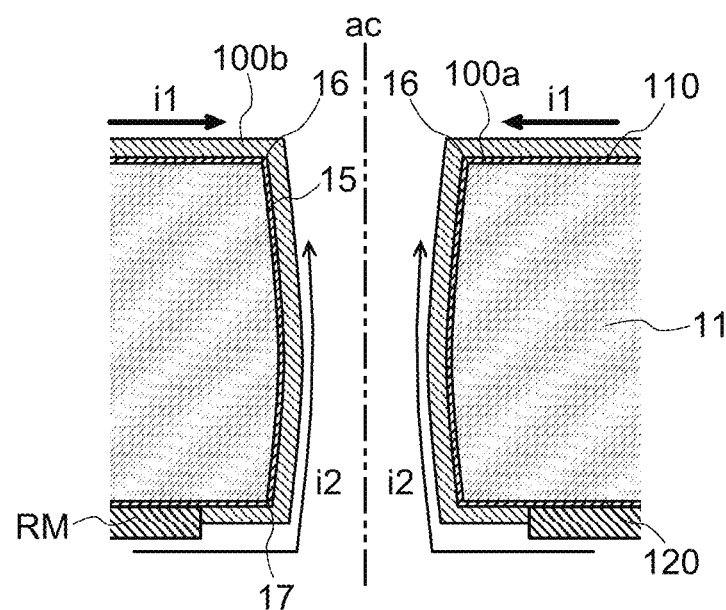
FIG. 30B illustrates an example of a second electroplating process.
Figure 30C:
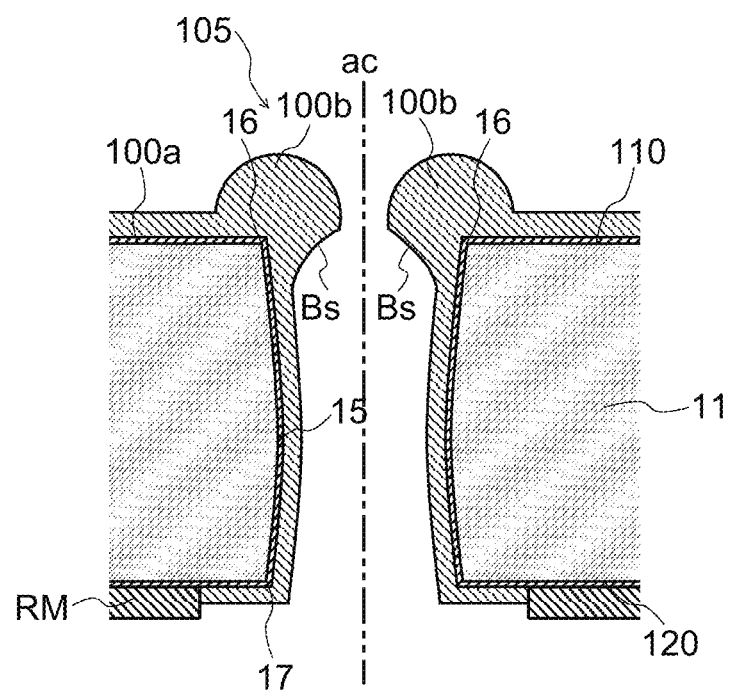
FIG. 30C illustrates an example of the second electroplating process.
Figure 30D:
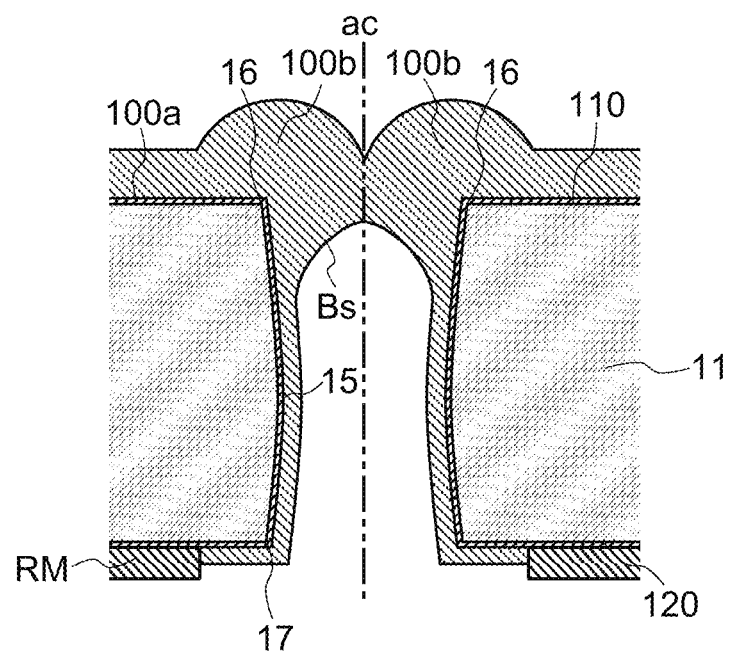
FIG. 30D illustrates an example of the second electroplating process.

FIGS. 30B to 30D illustrate an example of the second electroplating process. As illustrated in FIG. 30B, it is desirable that the first current i1 is greater than the second current i2 in the second electroplating process. For example, the first current i1 is greater than 1.5 times the second current i2. This allows the growth rate of the second metal layer 100b on the first surface 110 to be higher than the growth rate of the second metal layer 100b on the second surface 120. The first current i1 may be greater than or equal to 2.0 times, greater than or equal to 3.0 times, or greater than or equal to 5.0 times the second current i2. The first current i1 may be less than or equal to 5.0 times the second current i2.

The end of the through-hole 15 on the first surface 110 is also referred to as a "first end 16", and the end of the through-hole 15 on the second surface 120 is also referred to as a "second end 17". Since the first ratio L1 is greater than the second ratio L2 of the plating solution or since the first current i1 is greater than the second current i2, the growth rate of the second metal layer 100b at the first end 16 can be higher than the growth rate of the second metal layer 100b at the second end 17, as illustrated in FIG. 30C. For example, as illustrated in FIG. 30C, the cross section of the second metal layer 100b can partially have the shape of a circle having the center at the first end 16.

When the first current i1 is greater than the second current i2, the growth rate of the second metal layer 100b located on the internal surface of the through-hole 15 increases as the second metal layer 100b is closer to the first surface 110. Accordingly, as illustrated in FIG. 30C, the thickness of the second metal layer 100b located on the internal surface of the through-hole 15 decreases toward the second surface 120. As a result, inside the through-hole 15, the surface Bs of the second metal layer 100b formed around the first end 16 extends toward the second surface 120 as a distance from the central axis ac increases.

When the second metal layers 100b grown at respective positions around the first end 16 of the through-hole 15 merge into one, the second metal layer 100b can close the through-hole 15 at the first surface 110, as illustrated in FIG. 30D. In this manner, the closure portion 105 including the second metal layer 100b is obtained.

The growth rate of the second metal layer 100b located on the internal surface of the through-hole 15 decreases as a distance from the internal surface increases. Accordingly, the curvature of the surface Bs of the portion of the closure portion 105 that overlaps the central axis ac tends to be maximized.

Figure 31:
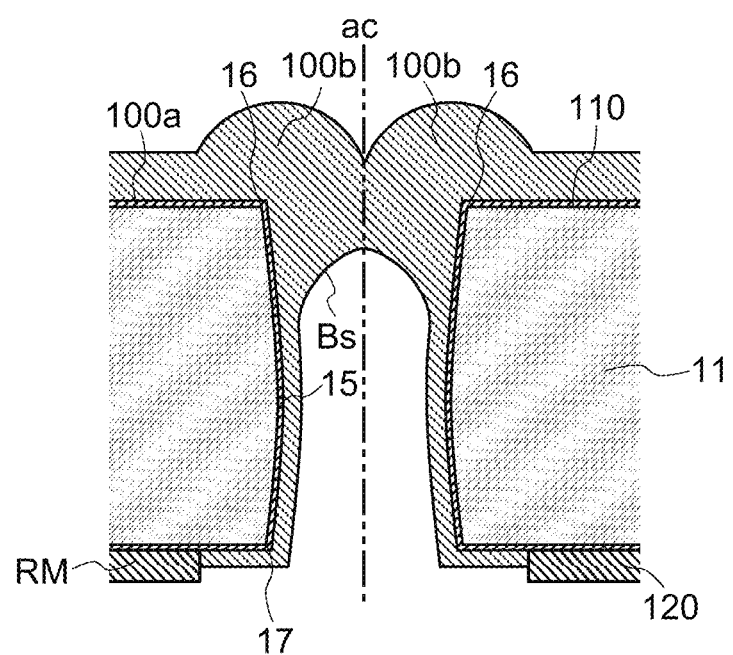
FIG. 31 illustrates an example of a sectional structure of a second metal layer.

The position and shape of the surface Bs of the closure portion 105 can be changed by controlling the first current i1 and the second current i2. Alternatively, the position and shape of the surface Bs of the closure portion 105 can be changed by controlling the first ratio L1 and the second ratio L2. FIG. 31 is a sectional view of the closure portion 105 obtained when the ratio of the first current i1 to the second current i2 is set to be greater than that in the example illustrated in FIGS. 30B to 30D. As illustrated in FIG. 31, by increasing the difference between the first current i1 and the second current i2, the position of the surface Bs of the closure portion 105 can be changed so as to move toward the second surface 120. In addition, by increasing the difference between the first current i1 and the second current i2, the radius of curvature of the surface Bs at the thinnest part of the closure portion 105 can be reduced.

Figure 9:
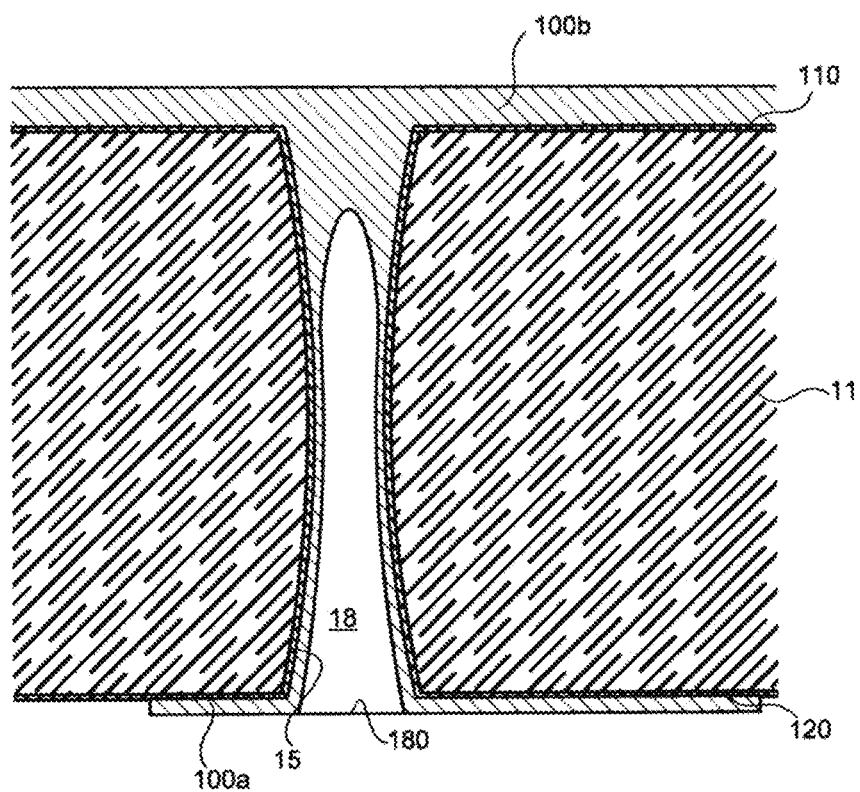
FIG. 9 illustrates the method for manufacturing the through electrode substrate according to the first embodiment of the present disclosure.
Figure 10:
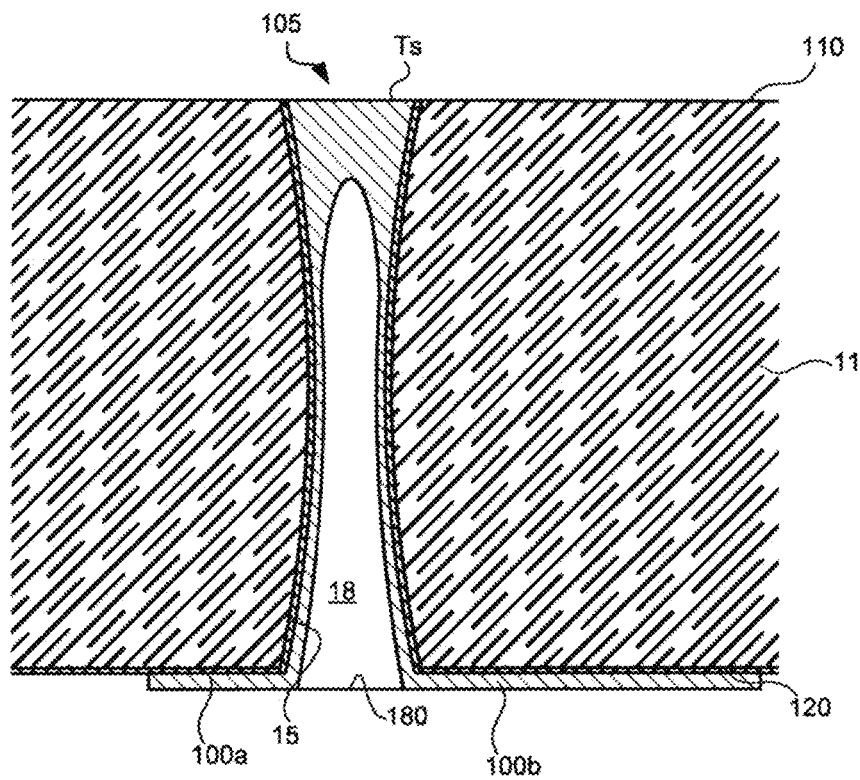
FIG. 10 illustrates the method for manufacturing the through electrode substrate according to the first embodiment of the present disclosure.

Subsequently, as illustrated in FIG. 9, the resist mask RM is removed. Thereafter, as illustrated in FIG. 10, the first metal layer 100a and the second metal layer 100b on the first surface 110 of the glass substrate 11 are removed by, for example, CMP (Chemical Mechanical Polishing) treatment to expose the first surface 110. Note that to remove the first metal layer 100a and the second metal layer 100b, another process, such as a wet etching process, a grinding process by fly cutter, or physical mechanical polishing, may be used. The process illustrated in FIG. 10 may be performed prior to the process illustrated in FIG. 9.

Figure 11:
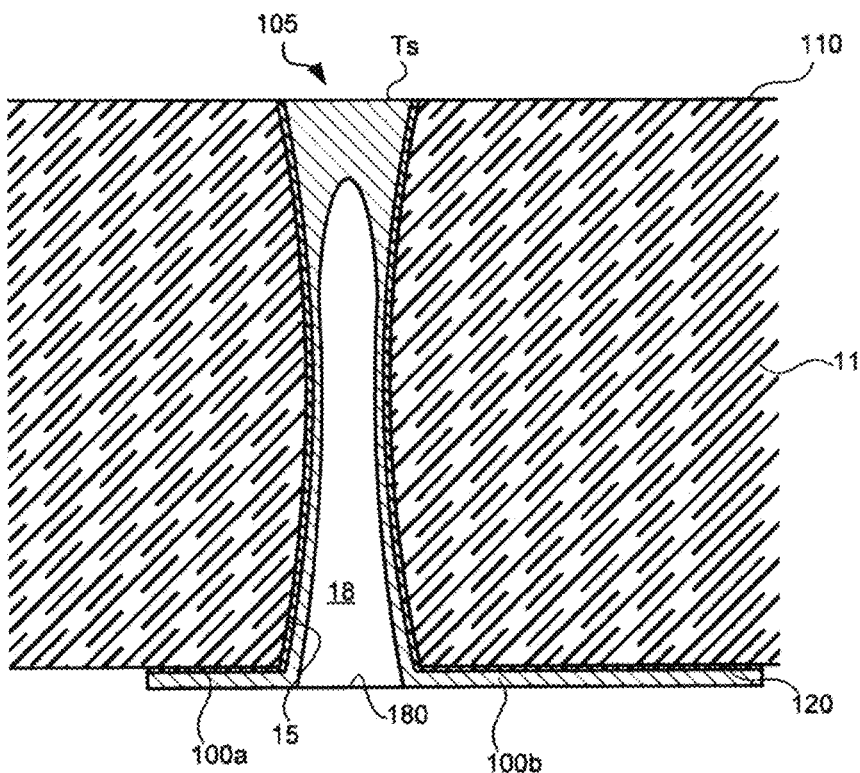
FIG. 11 illustrates the method for manufacturing the through electrode substrate according to the first embodiment of the present disclosure.

Subsequently, as illustrated in FIG. 11, the first metal layer 100a on the second surface 120 of the glass substrate 11 is removed using the second metal layer 100b as a mask. In this manner, the through electrode substrate 10 having the through electrode 100 disposed therein is manufactured from the glass substrate 11. The process illustrated in FIG. 11 may be carried out prior to the process illustrated in FIG. 10. Note that in FIG. 2, the through electrode 100 is illustrated as an electrical conductor including the first metal layer 100a and the second metal layer 100b.

Working Example

Figure 12:
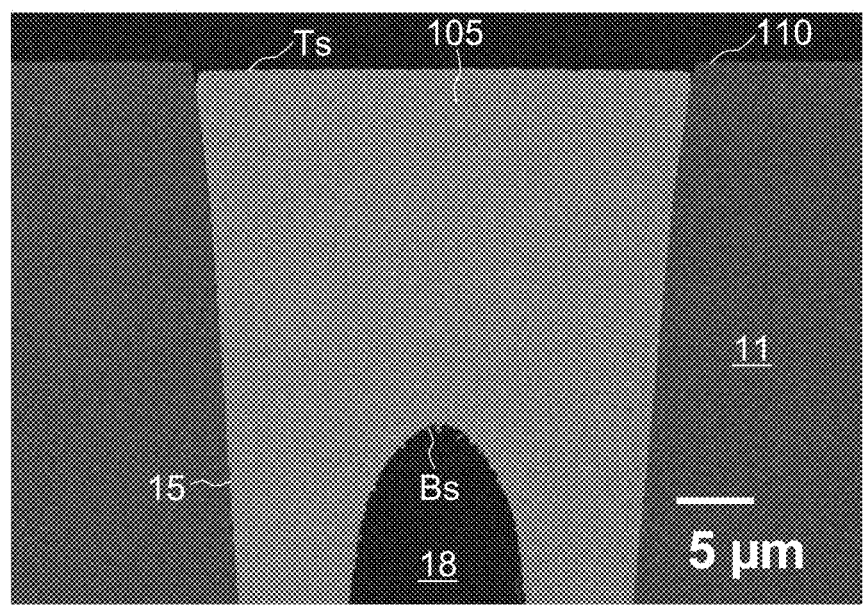
FIG. 12 is an electron micrograph of a cross section of a through electrode.

FIG. 12 is an electron micrograph of a cross section of a through electrode. The electron micrograph in FIG. 12 shows a cross section of the through electrode 100 manufactured by the above-described method for manufacturing the through electrode substrate 10. This cross section is a plane obtained by cutting the through electrode 100 so as to include the central axis of the through-hole 15. As shown in FIG. 12, a structure having the closure portion 105 in the through electrode 100 can be achieved.

Second Embodiment

A through electrode according to the second embodiment is manufactured using a method that differs from the first embodiment described above.

Figure 13:
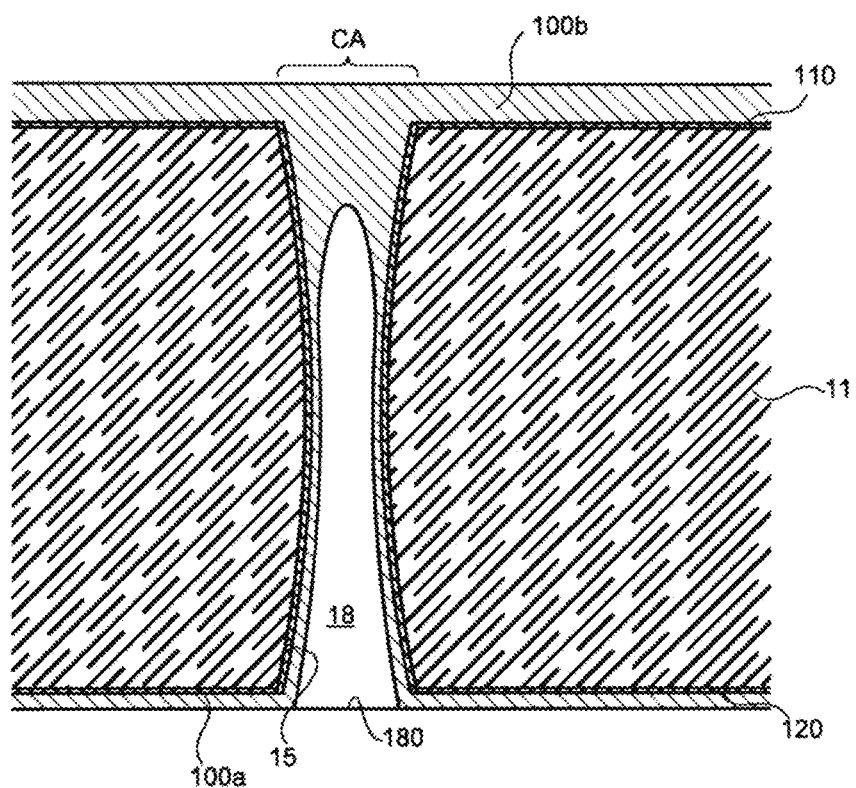
FIG. 13 illustrates a method for manufacturing a through electrode substrate according to a second embodiment of the present disclosure.
Figure 14:
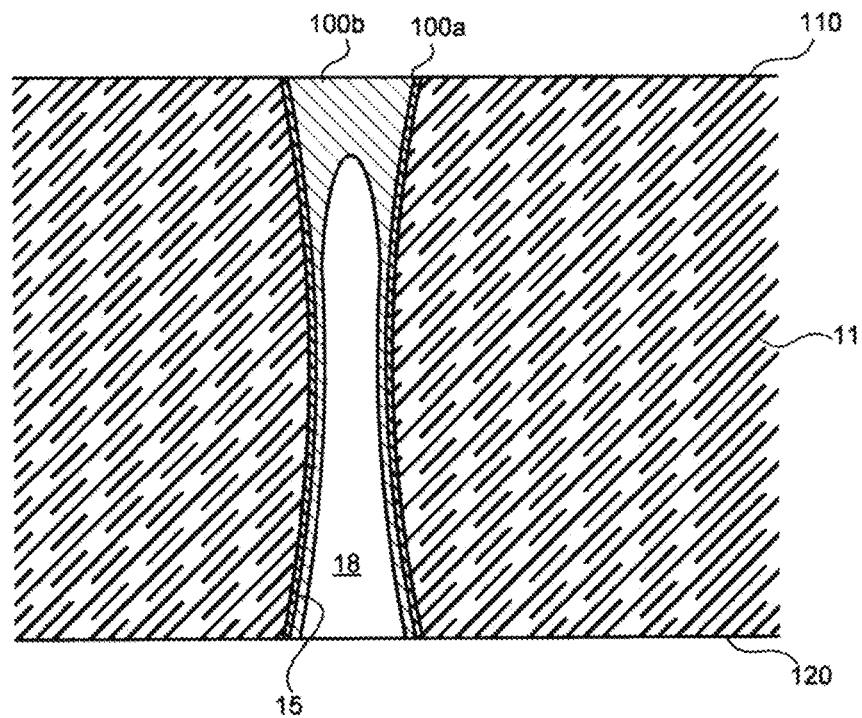
FIG. 14 illustrates the method for manufacturing the through electrode substrate according to the second embodiment of the present disclosure.
Figure 15:
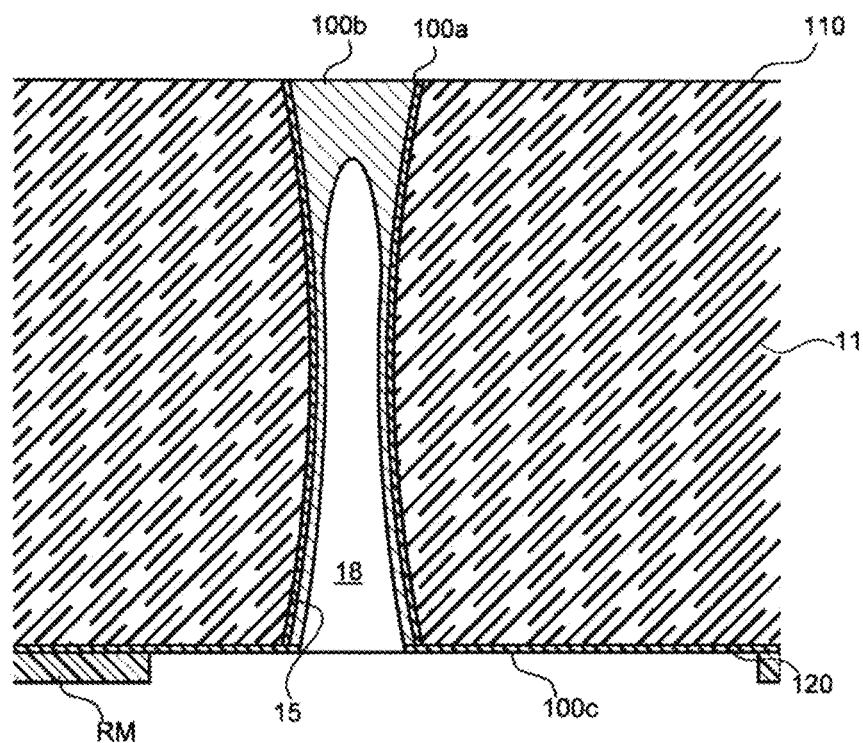
FIG. 15 illustrates the method for manufacturing the through electrode substrate according to the second embodiment of the present disclosure.

FIGS. 13 to 15 illustrate a method for manufacturing a through electrode substrate according to the second embodiment of the present disclosure. According to the second embodiment, as illustrated in FIG. 13, after the first metal layer 100a is formed as illustrated in FIG. 5 according to the first embodiment, the second metal layer 100b illustrated in FIGS. 7 and 8 is formed without forming the resist mask RM illustrated in FIG. 6. In this state, as illustrated in FIG. 14, the first metal layer 100a and the second metal layer 100b are removed by CMP treatment from both the first surface 110 and second surface 120 of the glass substrate 11 to expose both the surfaces of the glass substrate 11.

Subsequently, as illustrated in FIG. 15, a third metal layer 100c, which serves as a seed layer, is formed on the second surface 120 by the sputtering technique. Thereafter, a resist mask RM is formed over a partial region of the third metal layer 100c. In FIG. 15, the third metal layer 100c is formed only on the second surface 120. Although not illustrated, the third metal layer 100c may partially be formed on the second metal layer 100b inside the through-hole 15. Thereafter, a metal layer is grown on the third metal layer 100c by an electroplating process. Thereafter, the resist mask RM is removed, and an unnecessary metal layer is removed. As a result, a through electrode 100 with a structure similar to that illustrated in FIG. 2 is obtained. By performing the electroplating process on a portion adjacent to the second surface 120, that is, on the third metal layer 100c under the conditions that facilitate the growth of a metal layer on the third metal layer 100c (the conditions that differ from those for growing the second metal layer 100b), the thickness of the pad portion 102 made of the metal layer on the second surface 120 can be made greater than the thickness of the through portion 103. The term "unnecessary metal layer" refers to part of the third metal layer 100c that is covered by the resist mask RM. Depending on the conditions of the electroplating process, a metal layer may further be formed on the first surface 110 from the region of the through-hole 15. In this case, the metal layer on the first surface 110 may further be removed.

Third Embodiment

A through electrode according to the third embodiment is manufactured using a technique that differs from the first embodiment described above.

Figure 16:
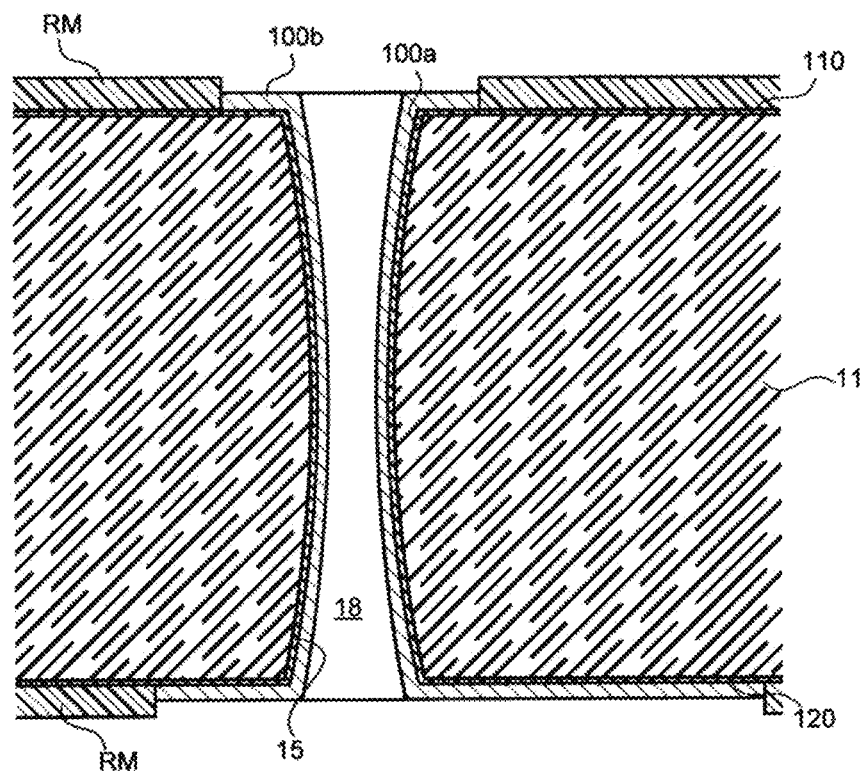
FIG. 16 illustrates a method for manufacturing a through electrode substrate according to a third embodiment of the present disclosure.
Figure 17:
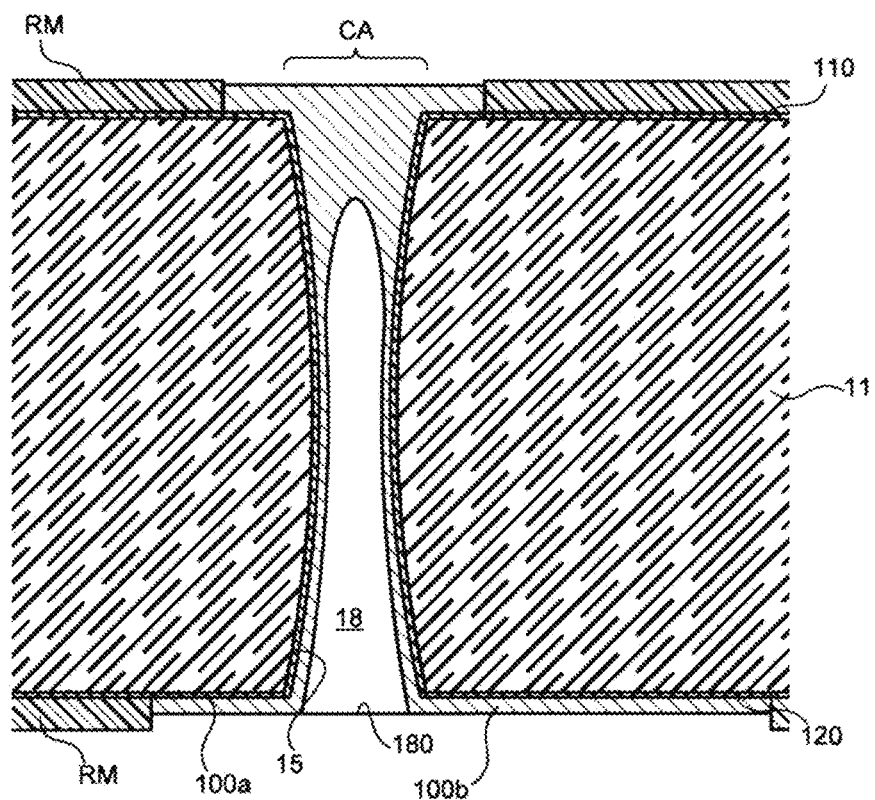
FIG. 17 illustrates the method for manufacturing the through electrode substrate according to the third embodiment of the present disclosure.
Figure 18:
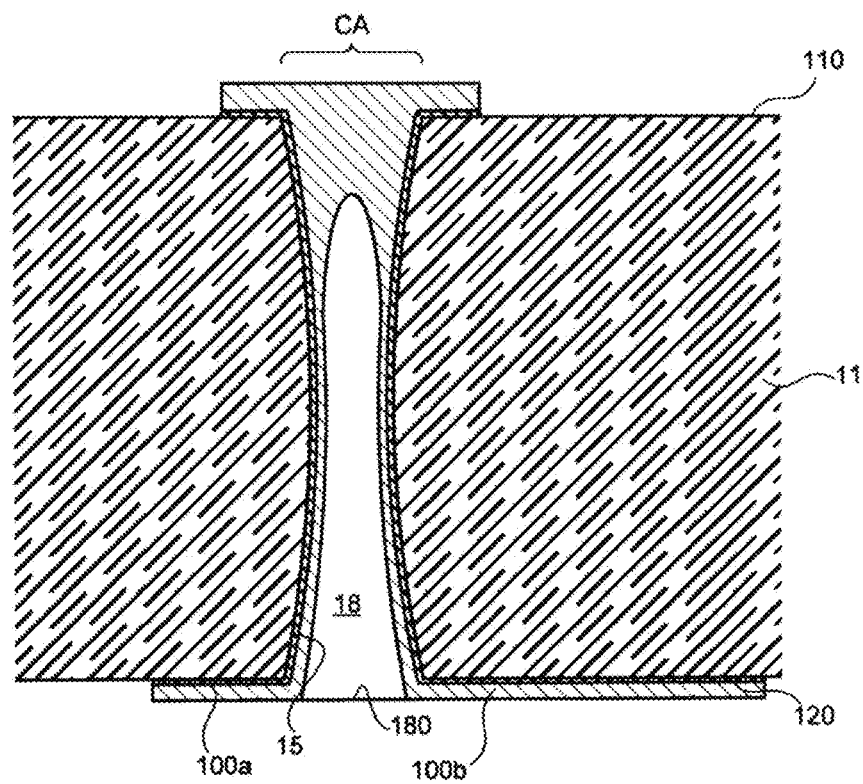
FIG. 18 illustrates the method for manufacturing the through electrode substrate according to the third embodiment of the present disclosure.

FIGS. 16 to 18 illustrate a method for manufacturing a through electrode substrate according to the third embodiment of the present disclosure. According to the third embodiment, when a resist mask RM is formed in the same manner as in the first embodiment illustrated in FIG. 7, a resist mask RM is further formed adjacent to the first surface 110 so as to cover part of the first metal layer 100a spaced apart from the through-hole 15. Subsequently, as illustrated in FIG. 16, the second metal layer 100b is grown by an electroplating process under the first condition. Thereafter, as illustrated in FIG. 17, the second metal layer 100b is further grown by electroplating process under the second condition. As a result, the region CA of the through-hole 15 is closed by the second metal layer 100b. By forming a resist mask RM adjacent to the first surface 110, the region where the second metal layer 100b grows can be limited at the first surface 110. Accordingly, the second metal layer 100b grows in a shorter time. As a result, the electroplating process can be performed efficiently. Subsequently, as illustrated in FIG. 18, the resist mask RM is removed. Thereafter, the first metal layer 100a and the second metal layer 100b protruding from the through-hole 15 beyond the first surface 110 are removed by CMP treatment or the like. As a result, the through electrode 100 with a structure similar to that illustrated in FIG. 2 is obtained.

Fourth Embodiment

According to the above-described first embodiment, the through-hole 15 has the minimum portion 15m located between the first surface 110 and the second surface 120, and the diameter of the through-hole 15 is minimized at the minimum portion 15m. According to the fourth embodiment, a through-hole 15A having a shape different from that of the through-hole 15 according to the first embodiment is formed in the glass substrate 11. More specifically, the through-hole 15A according to the fourth embodiment does not have the minimum portion 15m.

Figure 19:
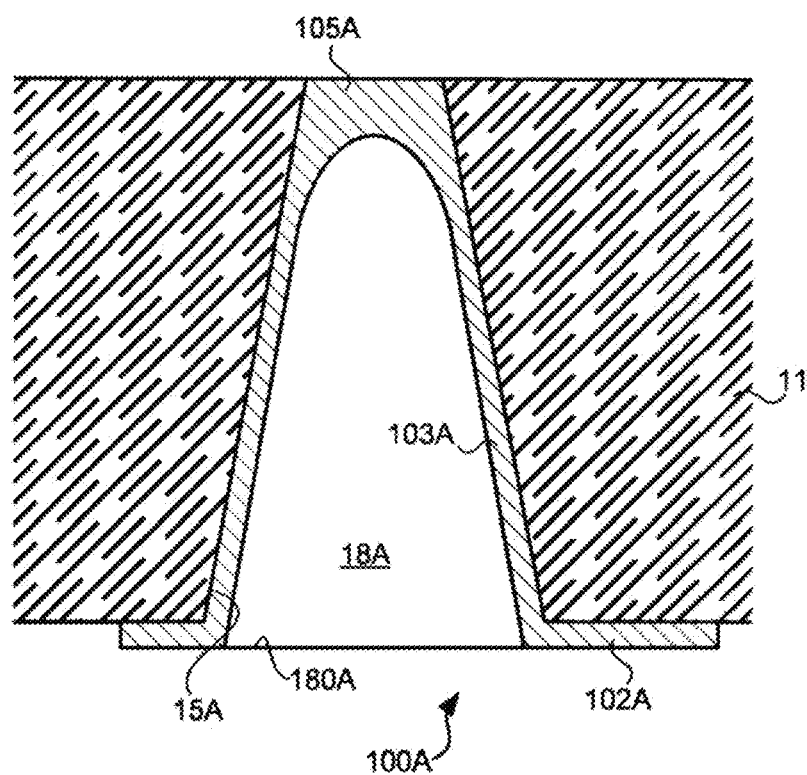
FIG. 19 illustrates a sectional structure of a through electrode according to a fourth embodiment of the present disclosure.

FIG. 19 illustrates a sectional structure of a through electrode according to the fourth embodiment of the present disclosure. The through-hole 15A is formed in the glass substrate 11. The through-hole 15A has a shape with a diameter that increases from the first surface 110 toward the second surface 120. The through-hole 15A is formed, for example, by performing a sandblasting process from the second surface 120 of the glass substrate 11. The through-hole 15A may be formed by emitting a laser beam to the glass substrate 11 under predetermined conditions and, thereafter, applying an etching process using a predetermined etchant. A through electrode 100A includes a pad portion 102A, a through portion 103A, and a closure portion 105A. The closure portion 105A is disposed so as to close a portion of the through-hole 15A adjacent to the first surface 110, that is, a portion of the through-hole 15A having a smaller diameter. A space 18A surrounded by the through electrode 100A inside the through-hole 15A is located so as to communicate with the space on the second surface 120 of the glass substrate 11 via an opening 180A. Note that as in FIG. 2, in FIGS. 19 and 20, the through electrode 100A is illustrated as an electric conductor including the first metal layer 100a with the second metal layer 100b.

Figure 20:
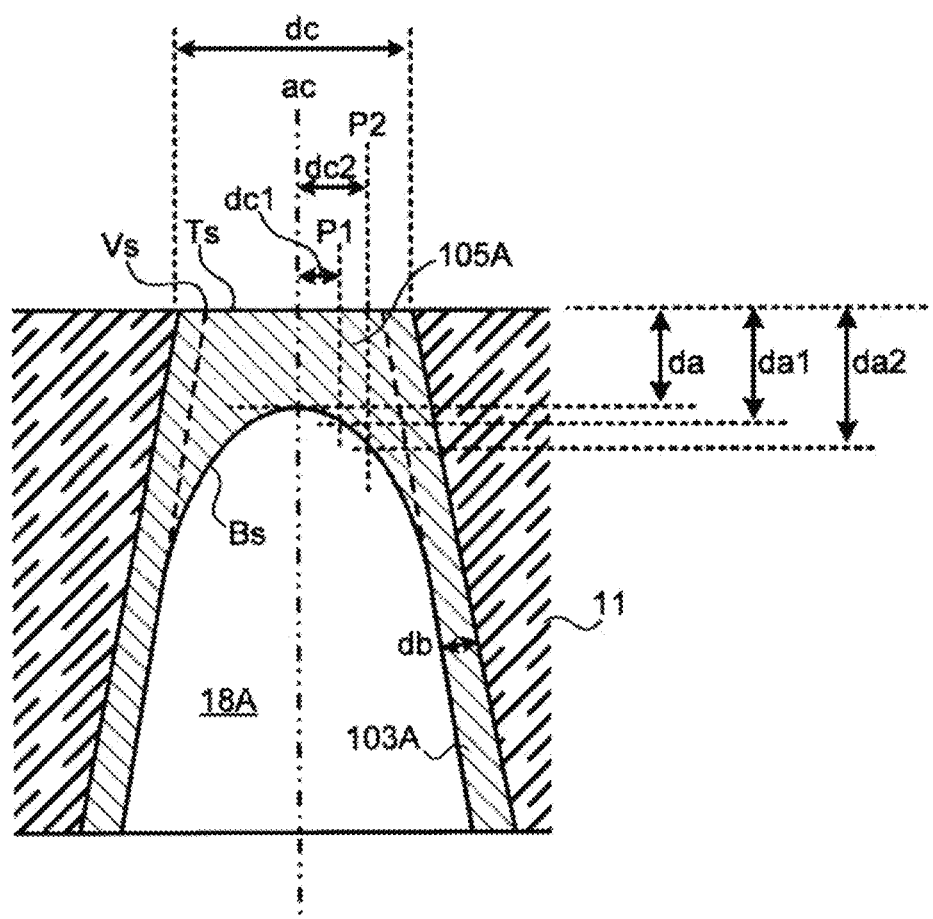
FIG. 20 illustrates a structure (a closure portion) of a through electrode adjacent to the first surface according to the fourth embodiment of the present disclosure.

FIG. 20 illustrates the structure of a through electrode adjacent to the first surface (the structure of a closure portion) according to the fourth embodiment of the present disclosure. The structure of the closure portion 105A is similar to that of the closure portion 105 according to the first embodiment. When each part is defined as illustrated in FIG. 20, the structure of the closure portion 105A also satisfies at least one of the conditions of the relationships R1 to R3. In an example illustrated in FIG. 20, the structure of the closure portion 105A satisfies all the conditions of the relationships R1 to R3. Due to the difference in the shape of the through-hole, the rate of an increase from da to da2 via da1 is less in the closure portion 105A than in the closure portion 105. However, even the closure portion 105A can have a strong retention force against the force exerted in a direction from the surface Ts to the interior of the through-hole 15.

Fifth Embodiment

In the fifth embodiment, a through electrode 100B is described below. The through electrode 100B has a filler placed in the space 18 formed in the through-hole 15 according to the first embodiment.

Figure 21:
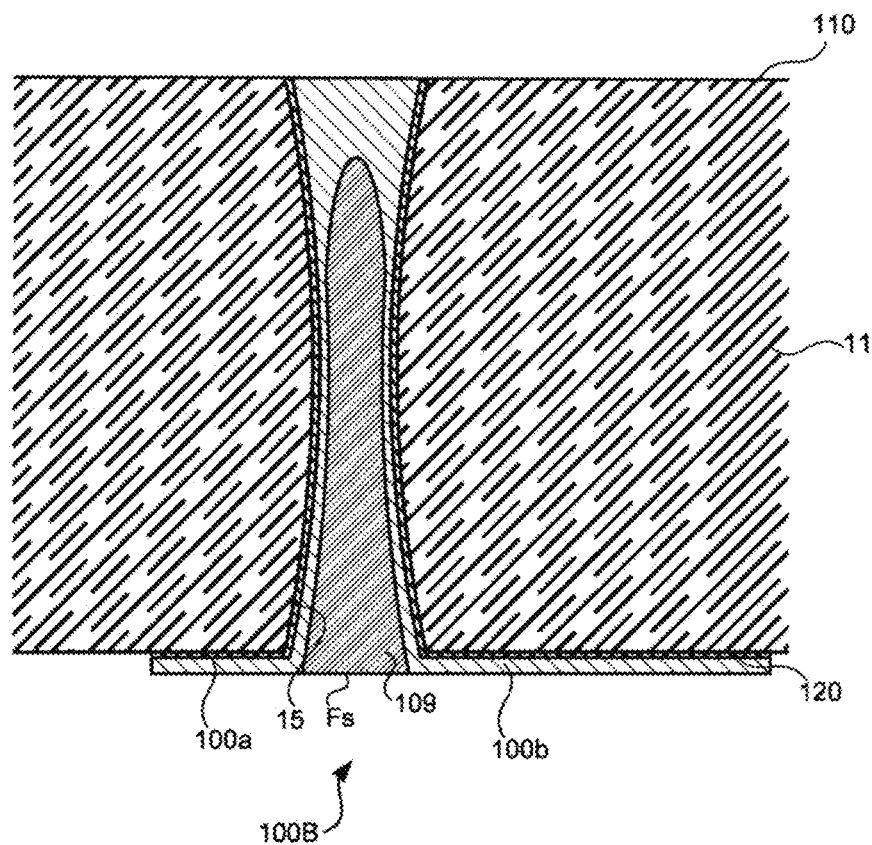
FIG. 21 illustrates a sectional structure of a through electrode according to a fifth embodiment of the present disclosure.

FIG. 21 illustrates a sectional structure of a through electrode according to the fifth embodiment of the present disclosure. A glass substrate 11 and a through electrode 100 in the state illustrated in FIG. 11 according to the first embodiment are prepared first. Subsequently, as illustrated in FIG. 21, a filler 109 is placed into the space 18 through the opening 180. The filler 109 in the form of a fluid is poured into the space 18 through the opening 180 and, thereafter, is solidified. In this manner, the filler 109 is formed. In this example, the filler 109 may be formed of an insulating material or a conductive material, such as a metal paste. Examples of a material with insulating properties include an organic resin and an inorganic compound. Examples of an organic resin include polyimide and acrylic. An example of an inorganic compound is silicon oxide or the like. The filler 109 may contain both organic resin and an inorganic compound. An example of a metal paste is a paste containing Cu, Ni, Ag, Au, or the like. A material poured into the space 18 through the opening 180 to form the filler 109 may or may not be photosensitive. By forming the filler 109 with the above-described material, the manufacturing cost can be reduced, and the stress caused by the through electrode can be reduced, as compared with the case where the space 18 is filled with the second metal layer 100b by an electroplating process. Although not illustrated, a space such as a void may exist inside the filler 109 or between the filler 109 and the substrate 11 as long as the reliability of the through electrode substrate 10 is ensured.

In the example illustrated in FIG. 21, the surface Fs of the filler 109 is positioned so as to be flush with the second metal layer 100b located on the second surface 120. Although not illustrated, the surface Fs may be positioned so as not to flush with the second metal layer 100b. That is, the surface Fs may be positioned so as to be flush with the second surface 120, may be positioned inside the through-hole 15, or may be positioned to protrude from the second metal layer 100b.

Sixth Embodiment

In the case where the filler 109 according to the fifth embodiment is an electrical conductor, the through electrode 100B can further be connected to the wiring layer at the position that overlaps the through-hole 15 adjacent to the second surface 120. According to the sixth embodiment, an example of a through electrode 100C is described in the case where the filler 109 is formed of a material having an electrical conductive property.

Figure 22:
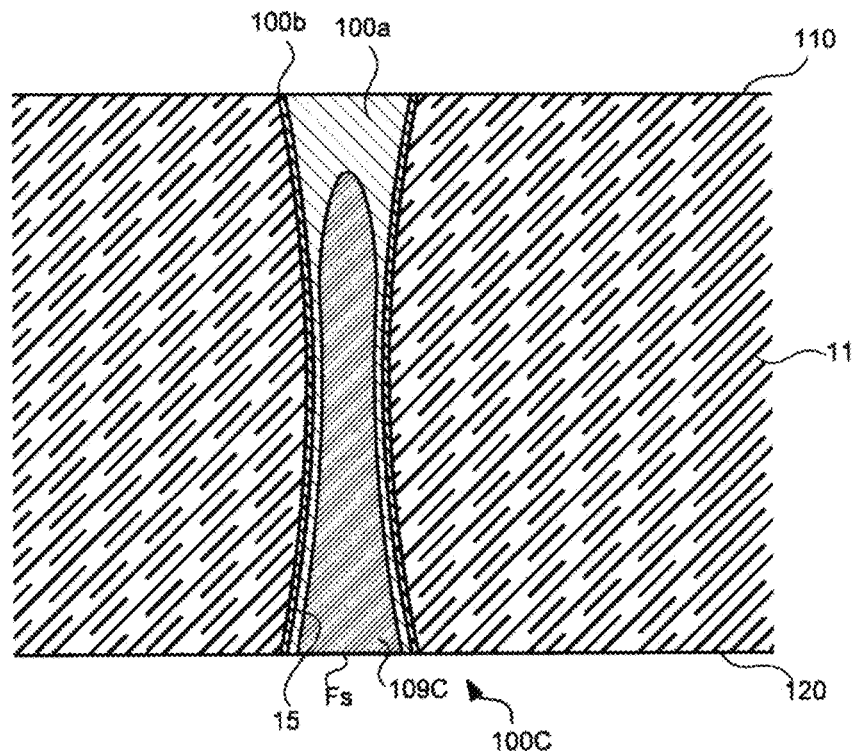
FIG. 22 illustrates a sectional structure of a through electrode according to a sixth embodiment of the present disclosure.

FIG. 22 illustrates a sectional structure of a through electrode according to the sixth embodiment of the present disclosure. The through electrode 100C illustrated in FIG. 22 further includes a filler 109 disposed inside the through electrode in the state illustrated in FIG. 14 according to the second embodiment. The filler 109 is an electrical conductor. The through electrode 100C includes a closure portion 105 including the second metal layer 100b exposed from the through-hole 15 at the first surface 110 and a filler 109C exposed from the through-hole 15 at the second surface 120. In addition, in the portions other than the through-hole 15, the first surface 110 and the second surface 120 of the glass substrate 11 are exposed.

Figure 23:
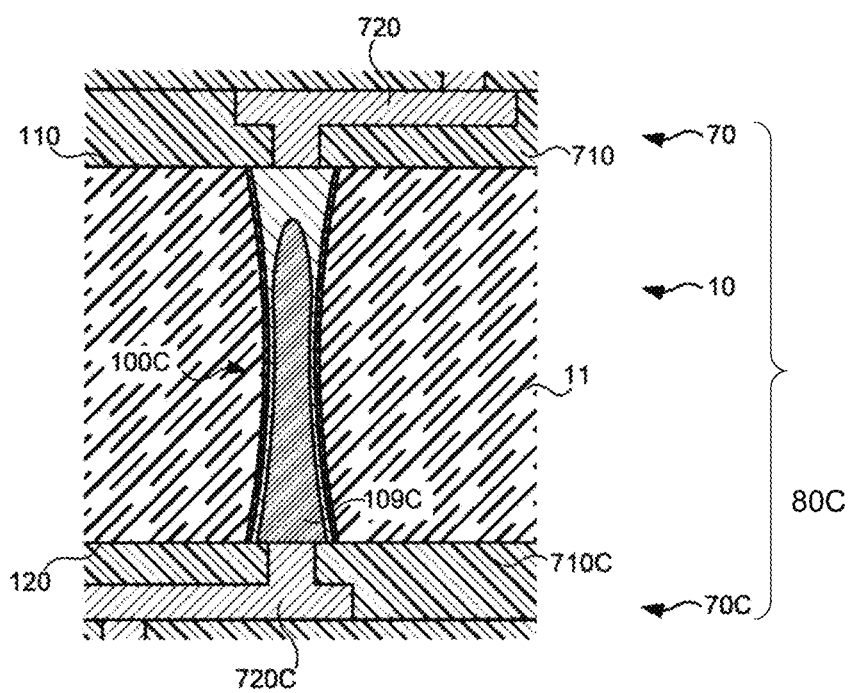
FIG. 23 illustrates a sectional structure of a wiring substrate according to the sixth embodiment of the present disclosure.

FIG. 23 illustrates a sectional structure of a wiring substrate according to the sixth embodiment of the present disclosure. A wiring substrate 80C illustrated in FIG. 23 includes a wiring laminate 70C disposed on the second surface 120 of the glass substrate 11 in addition to including the wiring substrate 80 according to the first embodiment. A wiring layer 720C in the wiring laminate 70C is connected to the filler 109C in the through electrode 100C. The wiring layer 720C in FIG. 23 is in contact with the surface Fs of the filler 109. In this example, as illustrated in FIG. 23, a contact region in which the surface Fs of the filler 109 is in contact with the wiring layer 720C is surrounded by the outer edge of the through-hole 15 on the second surface 120 when viewed in a direction perpendicular to the second surface 120. Although not illustrated, the contact region need not be surrounded by the outer edge of the through-hole 15 though the contact region overlaps the through-hole 15. The contact region is defined by an opening formed in an insulating interlayer 710C. The wiring layer 720C that is connected to the filler 109C is disposed in the opening. Although not illustrated, a pad that is connected to a bump may be formed on a surface of the wiring laminate 70C opposite from the glass substrate 11.

Seventh Embodiment

In the seventh embodiment, an example is described in which the structure of the through electrode 100C according to the sixth embodiment is applied to the through electrode 100A according to the fourth embodiment illustrated in FIG. 19.

Figure 24:
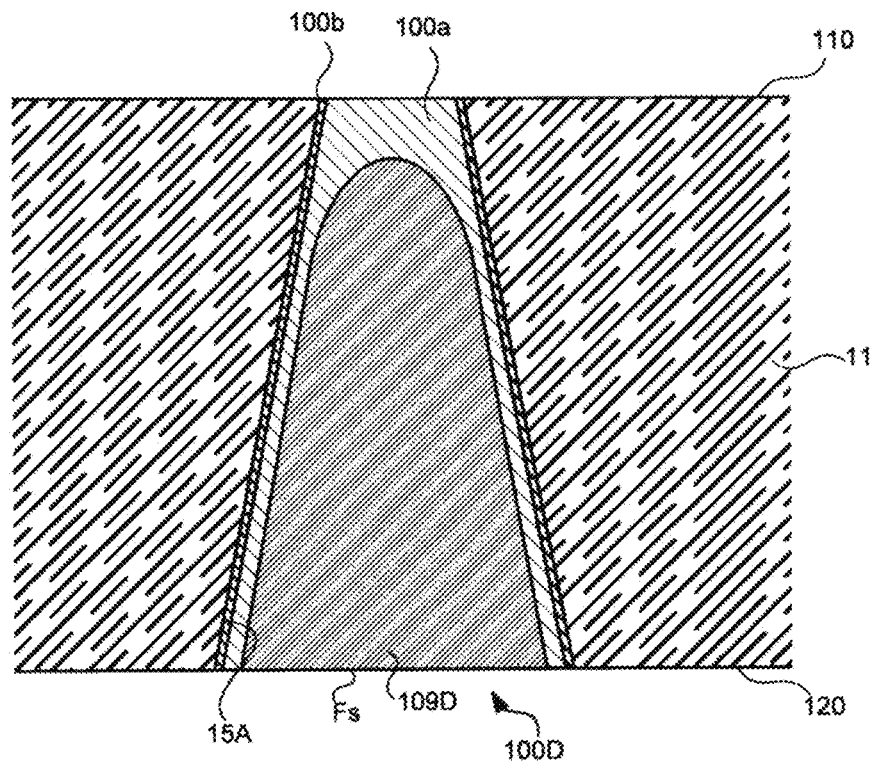
FIG. 24 illustrates a sectional structure of a through electrode according to a seventh embodiment of the present disclosure.

FIG. 24 illustrates a sectional structure of a through electrode according to the seventh embodiment of the present disclosure. A through electrode 100D illustrated in FIG. 24 is identical to the through electrode 100A illustrated in FIG. 19 according to the fourth embodiment, except for the following points:

The pad portion 102A is not provided.
The filler 109 is disposed inside the through electrode.

The through electrode 100D illustrated in FIG. 24 includes a closure portion 105A including the second metal layer 100b exposed from the through-hole 15A at the first surface 110 and a filler 109D exposed from the through-hole 15A at the second surface 120. In addition, in the portions other than the through-hole 15A, the first surface 110 and the second surface 120 of the glass substrate 11 are exposed. As in the case of the sixth embodiment, the structure allows the wiring layer to be connected to the filler 109D without using the pad portion 102A.

Eighth Embodiment

In the eighth embodiment, another method for manufacturing a through electrode that satisfies the relationship R1 (da<dc<da+db×2) is described.

Figure 25:
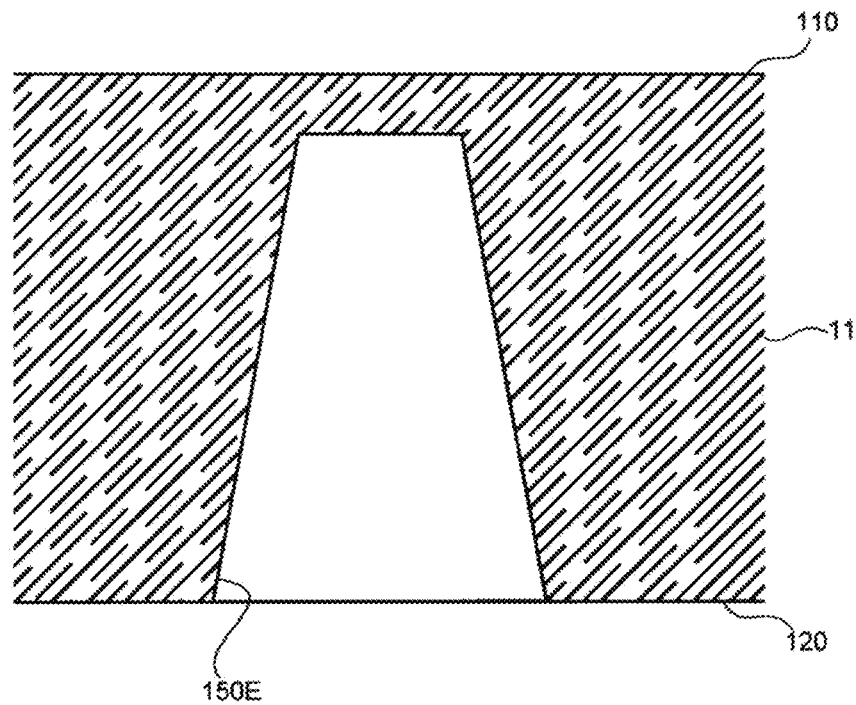
FIG. 25 illustrates a method for manufacturing a through electrode substrate according to an eighth embodiment of the present disclosure.
Figure 26:
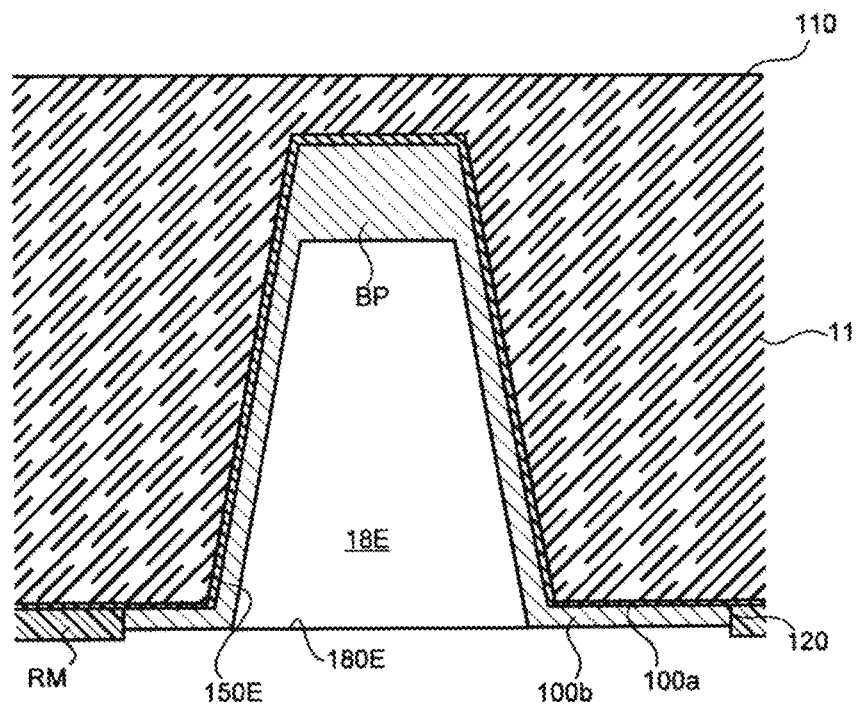
FIG. 26 illustrates the method for manufacturing the through electrode substrate according to the eighth embodiment of the present disclosure.

FIGS. 25 to 28 illustrate a method for manufacturing a through electrode substrate according to the eighth embodiment of the present disclosure. A hole is first formed in the glass substrate 11 from the second surface 120 by sandblasting or the like. Alternatively, a hole may be formed by emitting a laser beam to the glass substrate 11 under predetermined conditions and, thereafter, applying an etching process using a predetermined etchant. As illustrated in FIG. 25, a hole 150E that does not reach the first surface 110 is formed. The hole 150E has a bottom portion located adjacent to the first surface 110. Such a hole is also referred to as a bottomed hole. Subsequently, as illustrated in FIG. 26, a first metal layer 100a, which serves as a seed layer, is formed from the second surface 120 by the sputtering technique, a resist mask RM is formed, and a second metal layer 100b is formed by an electroplating process. The electroplating process here uses conditions that relatively decrease the growth rate adjacent to the surface of the glass substrate 11. For example, a plating solution containing an additive agent is used. As a result, a portion BP of the second metal layer 100b at the bottom of the bottomed hole 150E becomes thicker than the other portions of the second metal layer 100b. In addition, a space 18E surrounded by the second metal layer 100b is disposed inside the bottomed hole 150E so as to communicate with the space on the second surface 120 of the glass substrate 11 through an opening 180E.

Figure 27:
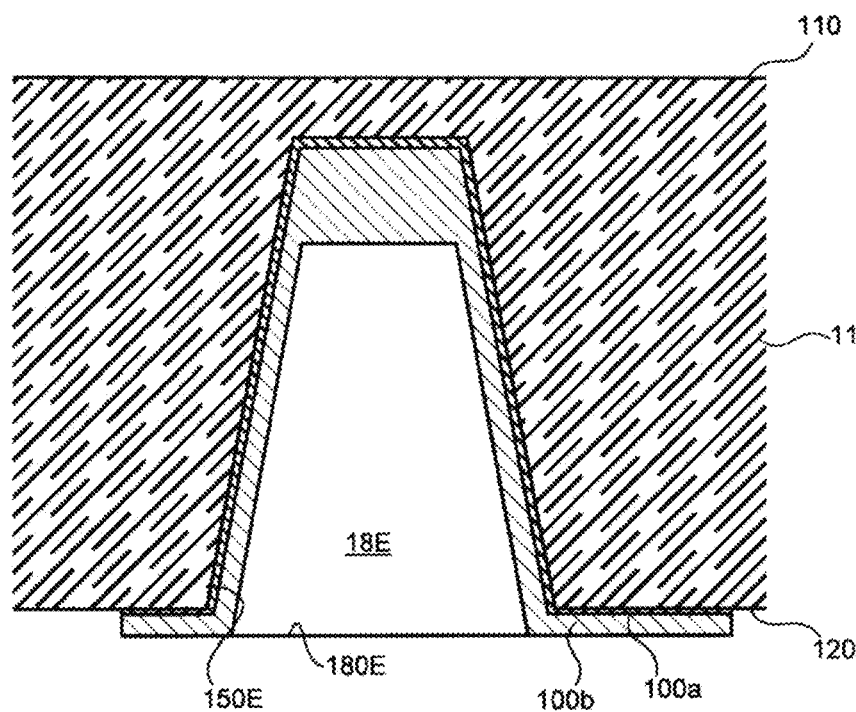
FIG. 27 illustrates the method for manufacturing the through electrode substrate according to the eighth embodiment of the present disclosure.
Figure 28:
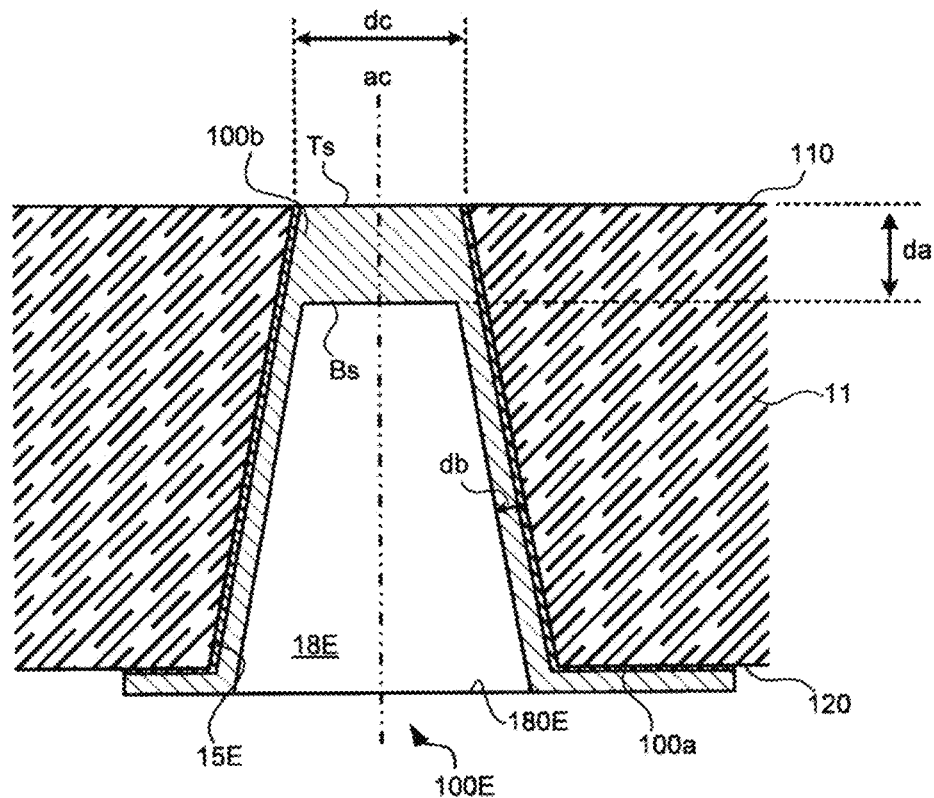
FIG. 28 illustrates the method for manufacturing the through electrode substrate according to the eighth embodiment of the present disclosure.

Subsequently, the resist mask RM is removed. Subsequently, as illustrated in FIG. 27, the first metal layer 100a in the region where the resist mask RM was placed is removed. Thereafter, as illustrated in FIG. 28, the first surface 110 of the glass substrate 11 is etched by CMP treatment or the like to expose the second metal layer 100b to the space on the first surface 110. As a result, the bottom of the bottomed hole 150E is removed, and a through-hole 15E is formed. Note that the first metal layer 100a may be exposed at the first surface 110 by performing the etching process so that the first metal layer 100a still remains.

In this manner, a through electrode 100E is formed so as to have a structure similar to the through electrode 100A according to the fourth embodiment illustrated in FIG. 19. In FIG. 28, parameters that define the relationship R1 are denoted. In FIG. 28, da denotes the thickness at the central axis ac. The structure of the through electrode 100A satisfies all of the relationships R1, R2, and R3, while the structure of the through electrode 100E satisfies only the relationship R1.

Ninth Embodiment

The electronic unit 1000 described above can be mounted in a variety of electrical devices, such as a mobile terminal (cell phones, smartphones, notebook personal computers, etc.), an information processing device (a desktop personal computer, a server, a car navigation system, or the like), and a home appliance.

Figure 29:
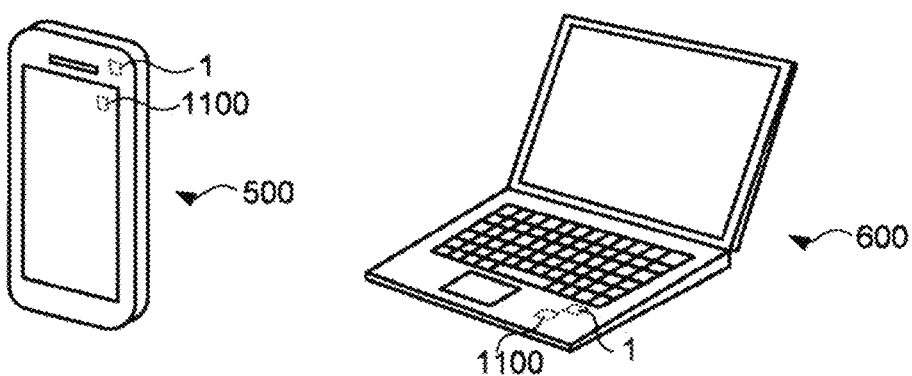
FIG. 29 illustrates an electronic device including the electronic unit according to the first embodiment of the present disclosure.

FIG. 29 illustrates an electronic device including an electronic unit according to the first embodiment of the present disclosure. The electronic unit 1000 is mounted in a variety of electrical devices, such as a mobile terminal (a cell phone, a smartphone, and a notebook personal computer), an information processing device (a desktop personal computer, a server, and a car navigation system), and a home appliance. As examples of electrical devices having the electronic unit 1000 mounted therein, a smartphone 500 and a notebook personal computer 600 are illustrated. Each of these electrical devices includes a control unit 1100 including a CPU or the like that executes application programs to provide a variety of functions. The variety of functions include a function that uses an output signal from the electronic unit 1000. Note that the electronic unit 1000 may have the functions of the control unit 1100.

Tenth Embodiment

Figure 32:
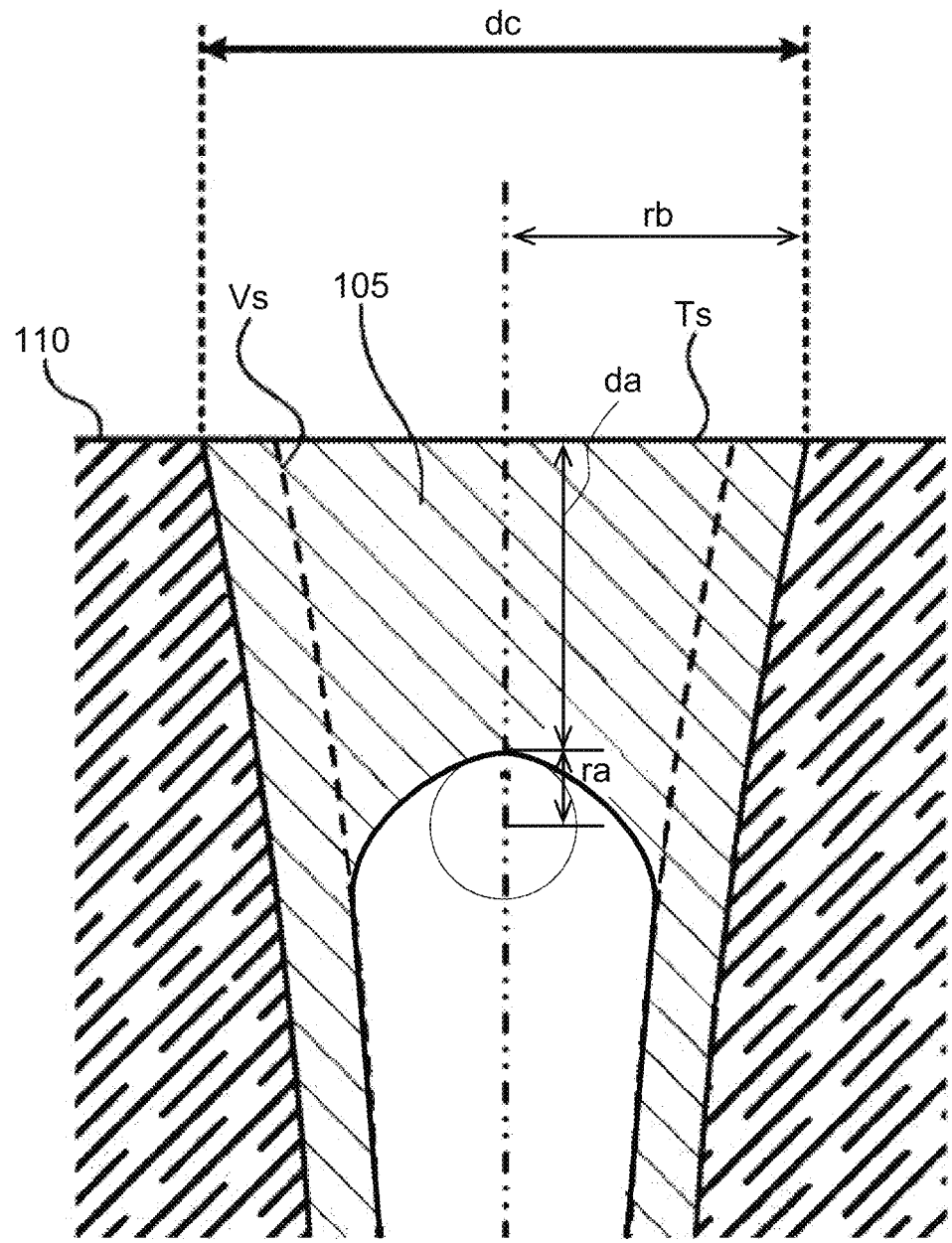
FIG. 32 illustrates an example of a sectional structure of a closure portion of a through electrode.

In the tenth embodiment, the radius of curvature ra of the surface Bs at the thinnest part of the closure portion 105 of the through electrode 100 is described with reference to FIG. 32. The radius of curvature ra is the reciprocal of the curvature of the surface Bs at the thinnest part of the closure portion 105.

The radius of curvature ra may be defined as the ratio to the radius rb of the through-hole 15 in the first surface 110. It is desirable that ra/rb be greater than or equal to 0.2. This inhibits the compressive force generated on the surface Bs at the thinnest part of the closure portion 105 from being excessively increased when the closure portion 105 is pressed. Accordingly, the occurrence of a defect, such as cracking, in the thinnest part of the closure portion 105 can be inhibited. The value of ra/rb may be greater than or equal to 0.4, and may be greater than or equal to 0.6.

In contrast, if ra/rb is excessively large, the closure portion 105 may fracture due to the inability to appropriately distribute the compressive force generated in the closure portion 105 to the surrounding regions when the closure portion 105 is pressed. Considering this point, it is desirable that ra/rb be less than or equal to 1.5. The value (ra/rb) may be less than or equal to 1.3, and may be less than or equal to 1.1.

In addition, to inhibit occurrence of defects, such as cracking, it is effective to appropriately set the thickness da of the thinnest part of the closure portion 105. It is desirable that the thickness da be greater than or equal to 10 μm. This ensures the mechanical strength of the thinnest part of the closure portion 105. The thickness da may be greater than or equal to 20 μm or may be greater than or equal to 30 μm. However, if the thickness da is excessively large, it is difficult to relieve, at the surface Ts, the internal stress in the closure portion 105. In this case, fracture of the closure portion 105 and cracking of the substrate 11 may occur. Considering this point, it is desirable that the thickness da be less than or equal to 100 µm. The thickness da may be less than or equal to 80 µm, and may be less than or equal to 60 µm.

Eleventh Embodiment

Figure 34:
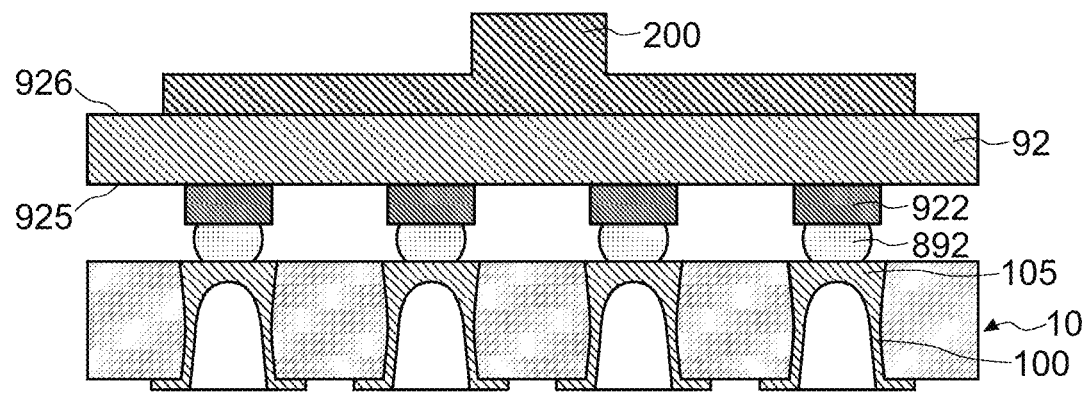
FIG. 34 illustrates the example of the method for manufacturing the electronic unit.
Figure 35:
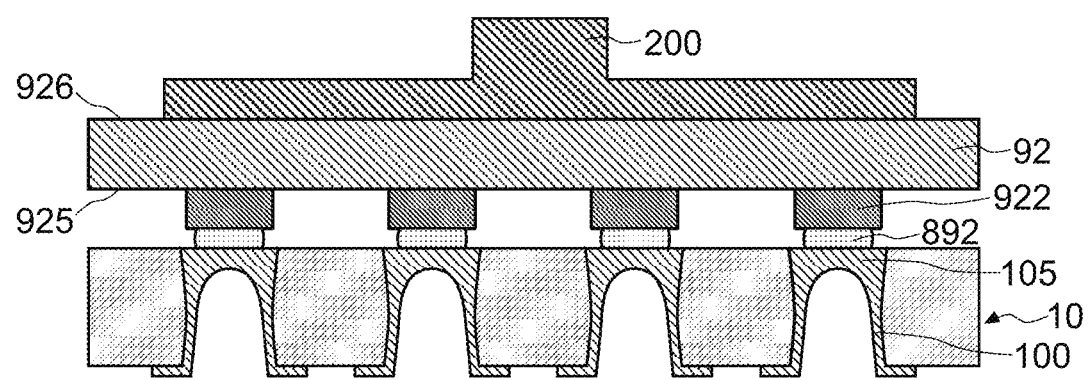
FIG. 35 illustrates the example of the method for manufacturing the electronic unit.

In the eleventh embodiment, an example of electrical connection between the through electrode 100 of the through electrode substrate 10 and the electronic device 92 is described with reference to FIGS. 33 to 35. More specifically, a method is described in which the through electrode 100 is electrically connected to an electrode of the electronic device 92 by heating the electronic device 92 with pressure toward the through electrode substrate 10 being applied to the electronic device 92. The method is also referred to as TCB (Thermal Compression Bonding).

Figure 33:
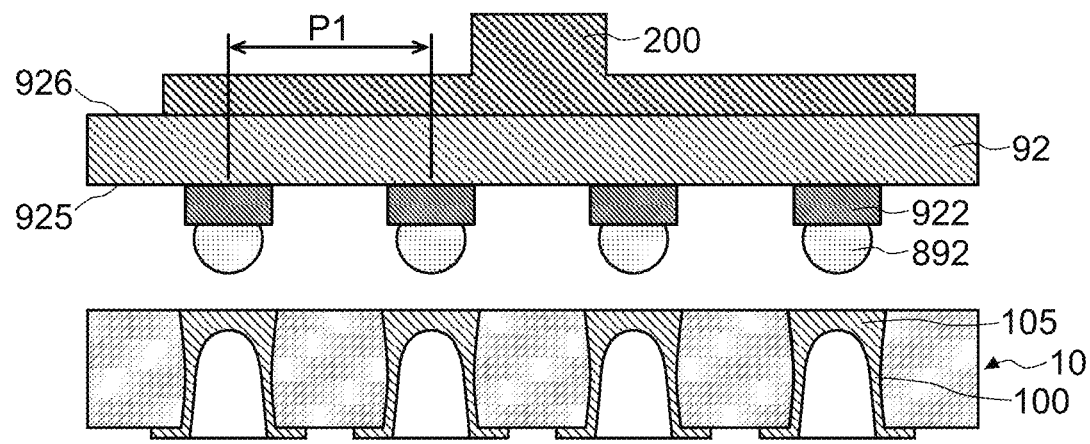
FIG. 33 illustrates an example of a method for manufacturing an electronic unit.

As illustrated in FIG. 33, the electronic device 92 includes a first surface 925, a second surface 926, and an electrode 922 located on the first surface 925. The electrode 922 may include a pad. The electrode 922 may include a pad and a pillar located on the pad. The structure of the electrode 922 including a pillar is particularly employed when a pitch P between the electrodes 922 is small. The pitch P is, for example, less than or equal to 100 µm. A bump 892 may be provided on the electrode 922.

As illustrated in FIG. 33, a bonding head 200 is first attached to the second surface 926 of the electronic device 92. Thereafter, as illustrated in FIG. 34, the bonding head 200 is moved toward the through electrode substrate 10 to bring the bump 892 into contact with the closure portion 105 of the through electrode 100. In addition, the electronic device 92 is heated by using the bonding head 200. In this manner, a heating and pressing process can be carried out to heat the electronic device 92 with pressure toward the through electrode substrate 10 being applied to the electronic device 92. Thereafter, the temperature of the bonding head 200 is maintained at a constant level with the pressure toward the through electrode substrate 10 being set to zero or approximately zero. This allows the electrode 922 to be connected to the closure portion 105 via the bump 892, as illustrated in FIG. 35.

To connect the electrode 922 to the closure portion 105 by the heating and pressing process, it is desirable that the force applied to one electrode 922 be greater than or equal to a threshold value. The threshold is, for example, 0.001 kgf and may be 0.006 kgf or 0.1 kgf. In this case, the closure portion 105 is required to withstand the force greater than or equal to the threshold value.

According to the through electrode substrate 10 of the present application, at least one of the above-described relationships R1 to R3 is satisfied. This allows the closure portion 105 to withstand a force greater than or equal to the threshold value.

Twelfth Embodiment

In the twelfth embodiment, an example of a structure is described. The structure is provided for electrically connecting the closure portion 105 of the through electrode substrate 10 to the electrode 922 of the electronic device 92.

Figure 36:
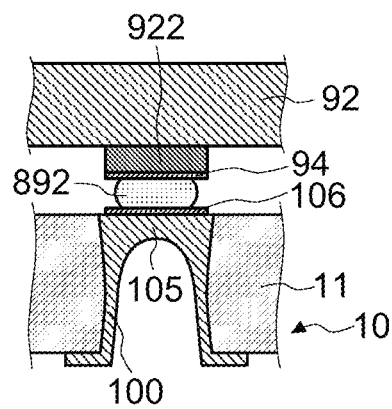
FIG. 36 illustrates an example of a structure for connecting a closure portion of a through electrode substrate to an electrode of an electronic device.

As illustrated in FIG. 36, a diffusion barrier film 94 may be provided on the electrode 922 of the electronic device 92. The diffusion barrier film 94 includes, for example, a nickel layer located on the electrode 922 and a gold layer located on the nickel layer. The diffusion barrier film 94 may be formed by electroless plating or electroplating.

As illustrated in FIG. 36, a diffusion barrier film 106 may be provided on the closure portion 105 of the through electrode substrate 10. Like the diffusion barrier film 94, the diffusion barrier film 106 may include a nickel layer located on the closure portion 105 and a gold layer located on the nickel layer.

Thirteenth Embodiment

In the thirteenth embodiment, an example of a structure is described. The structure is provided for electrically connecting the closure portion 105 of the through electrode substrate 10 to the electrode 922 of the electronic device 92.

Figure 37:
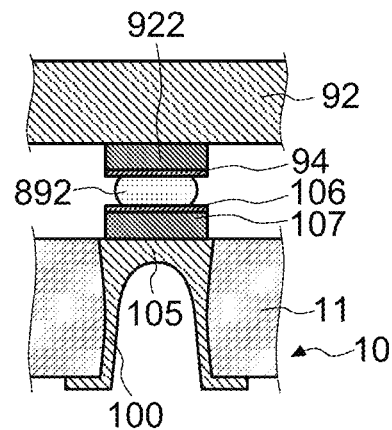
FIG. 37 illustrates an example of a structure for connecting a closure portion of a through electrode substrate to an electrode of an electronic device.

As illustrated in FIG. 37, an electrode 107 may be provided on the closure portion 105 of the through electrode substrate 10. The electrode 107 may include a pad. The electrode 107 may include a pad and a pillar located on the pad.

As in the example illustrated in FIG. 36, a diffusion barrier film 106 may be provided on the electrode 107. Although such an example is not illustrated, the diffusion barrier film 106 is not necessarily provided. In addition, as in the example illustrated in FIG. 36, the diffusion barrier film 94 may be provided on the electrode 922. Although such an example is not illustrated, the diffusion barrier film 94 is not necessarily provided.

Fourteenth Embodiment

Figure 38:
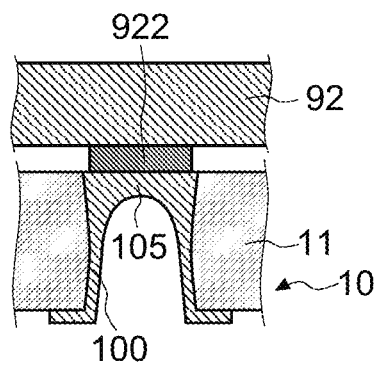
FIG. 38 illustrates an example of the structure for connecting a closure portion of a through electrode substrate to an electrode of an electronic device.

In the fourteenth embodiment, an example of a structure is described. The structure is provided for electrically connecting the closure portion 105 of the through electrode substrate 10 to the electrode 922 of the electronic device 92. As illustrated in FIG. 38, the electrode 922 of the electronic device 92 may be connected to the closure portion 105 of the through electrode substrate 10 without using a bump. Both the electrode 922 and the closure portion 105 may contain copper. In this case, a Cu—Cu junction can be used to connect the electrode 922 to the closure portion 105.

Fifteenth Embodiment

Figure 39:
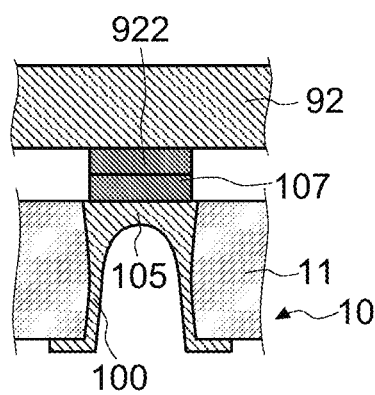
FIG. 39 illustrates an example of a structure for connecting a closure portion of a through electrode substrate to an electrode of an electronic device.

In the fifteenth embodiment, an example of a structure is described. The structure is provided for electrically connecting the closure portion 105 of the through electrode substrate 10 to the electrode 922 of the electronic device 92. As illustrated in FIG. 39, the electrode 922 of the electronic device 92 may be connected to the electrode 107 on the closure portion 105 of the through electrode substrate 10 without using a bump. Both electrode 922 and electrode 107 may contain copper. In this case, a Cu—Cu junction can be used to connect the electrode 922 to the electrode 107.

Sixteenth Embodiment

Figure 40A:
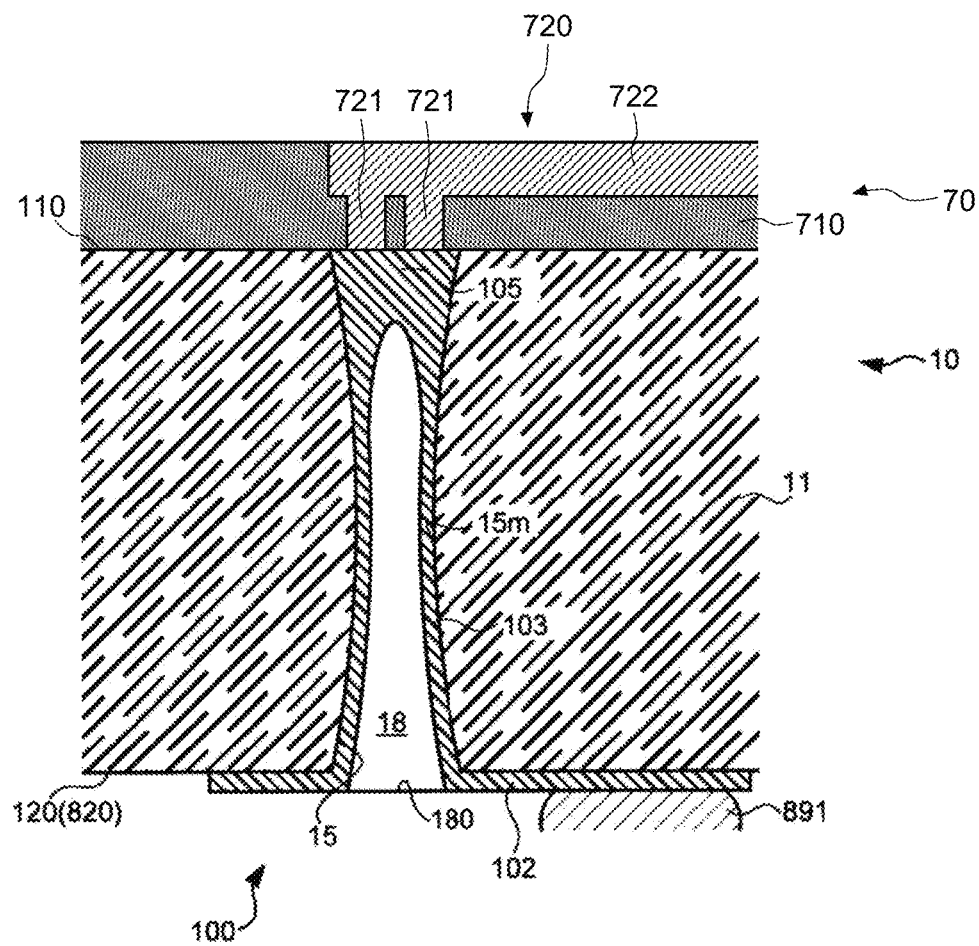
FIG. 40A illustrates an example of a sectional structure of a wiring layer connected to a closure portion of a through electrode substrate.
Figure 40B:
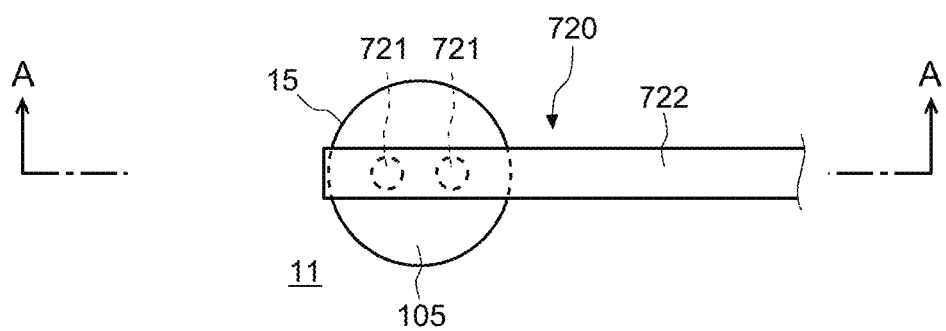
FIG. 40B is a plan view of the wiring layer illustrated in FIG. 40A.

In the sixteenth embodiment, an example of a sectional structure of a wiring layer 720 connected to the closure portion 105 of the through electrode substrate 10 is described with reference to FIGS. 40A and 40B. FIG. 40A is a sectional view of a wiring layer. FIG. 40B is a plan view of the wiring layer. FIG. 40A is a sectional view of the wiring layer taken along line A-A of FIG. 40B.

As illustrated in FIGS. 40A and 40B, a contact region where the wiring layer 720 is in contact with the closure portion 105 may include a plurality of regions. For example, the wiring layer 720 may include an interconnection wire 722 extending in the in-plane direction of the first surface 110 of the through electrode substrate 10 and a plurality of connection layers 721 that connect the interconnection wire 722 to the closure portion 105. As illustrated in FIG. 40B, when viewed in the direction perpendicular to the first surface 110, the plurality of connection layers 721 may be surrounded by the outer edge of the through-hole 15 on the first surface 110.

Seventeenth Embodiment

Figure 41A:
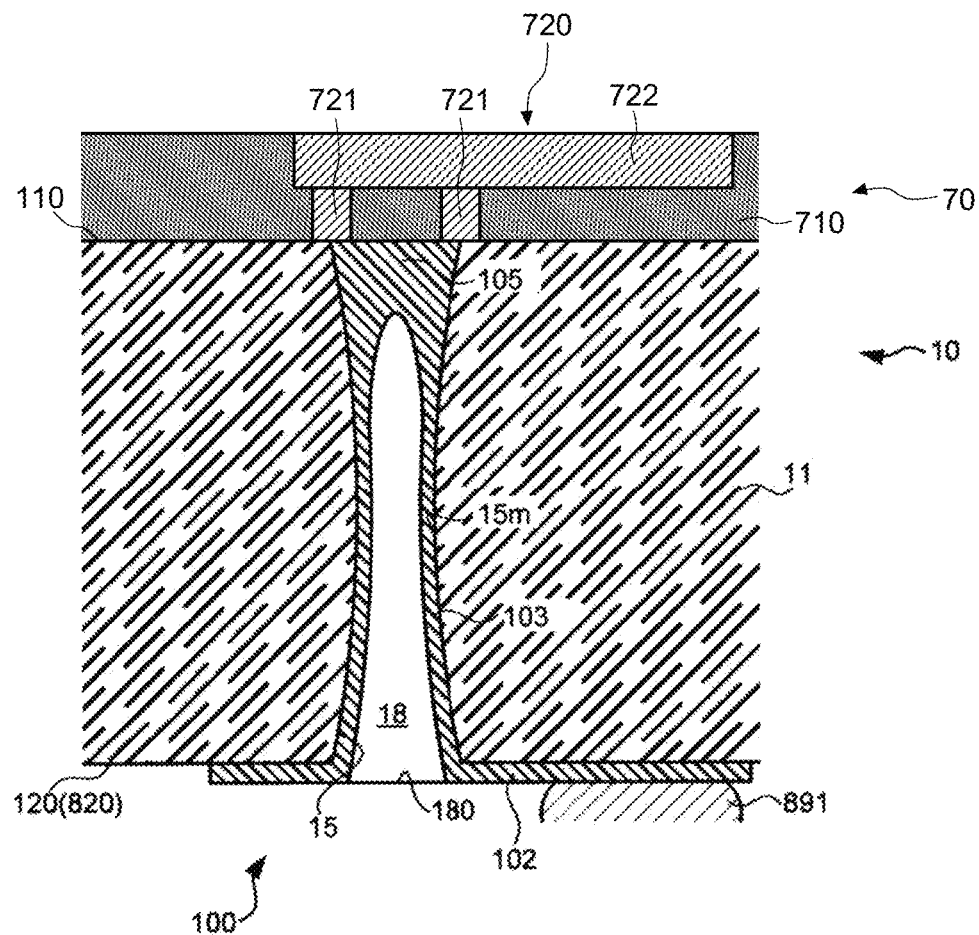
FIG. 41A illustrates an example of a sectional structure of a wiring layer connected to a closure portion of a through electrode substrate.
Figure 41B:
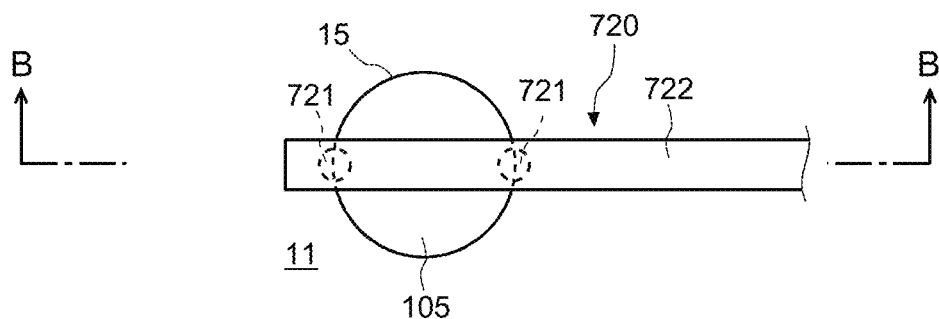
FIG. 41B is a plan view of the wiring layer illustrated in FIG. 41A.

In the seventeenth embodiment, an example of a sectional structure of the wiring layer 720 connected to the closure portion 105 of the through electrode substrate 10 is described with reference to FIGS. 41A and 41B. FIG. 41A is a sectional view of the wiring layer. FIG. 41B is a plan view of the wiring layer. FIG. 41A is a sectional view of the wiring layer taken along line B-B of FIG. 41B.

As in the example illustrated in FIGS. 40A and 40B, the contact region where the wiring layer 720 is in contact with the closure portion 105 may include a plurality of regions. For example, the wiring layer 720 may include an interconnection wire 722 extending in the in-plane direction of the first surface 110 of the through electrode substrate 10 and a plurality of connection layers 721 connecting the interconnection wire 722 to the closure portion 105. As illustrated in FIG. 41B, when viewed in the direction perpendicular to the first surface 110, the plurality of connection layers 721 may overlap the outer edge of the through-hole 15 on the first surface 110.

Eighteenth Embodiment

Figure 42A:
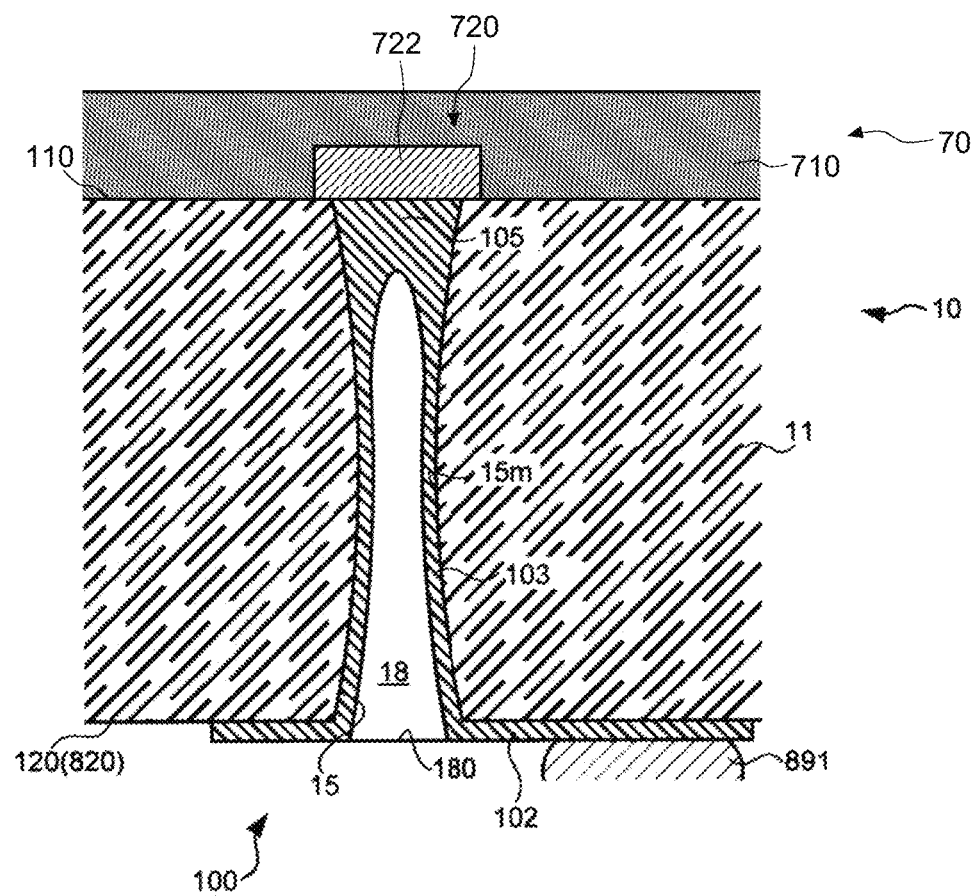
FIG. 42A illustrates an example of a sectional structure of a wiring layer connected to a closure portion of a through electrode substrate.
Figure 42B:
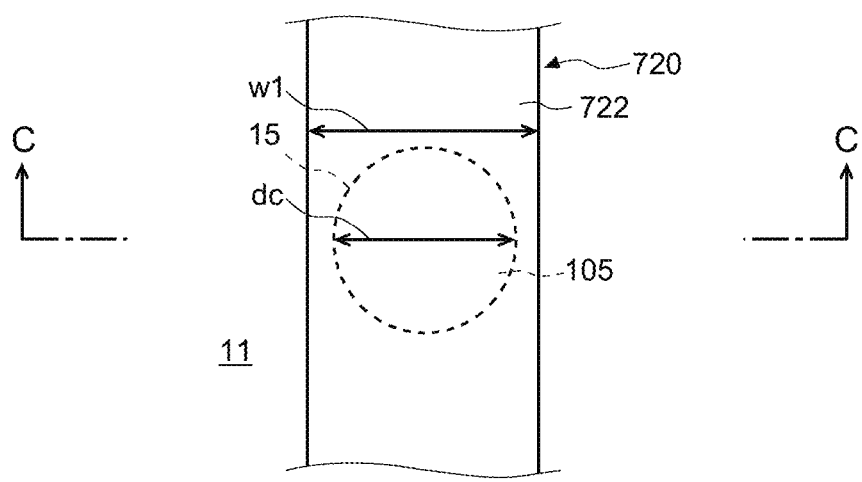
FIG. 42B is a plan view of the wiring layer illustrated in FIG. 42A.

In the eighteenth embodiment, an example of the sectional structure of the wiring layer 720 connected to the closure portion 105 of the through electrode substrate 10 is described with reference to FIGS. 42A and 42B. FIG. 42A is a sectional view of the wiring layer. FIG. 42B is a plan view of the wiring layer. FIG. 42A is a sectional view of the wiring layer taken along line C-C of FIG. 42B.

As illustrated in FIGS. 42A and 42B, when viewed in the direction perpendicular to the first surface 110, the contact region where the wiring layer 720 is in contact with the closure portion 105 may surround the outer edge of the through-hole 15 on the first surface 110. For example, the wiring layer 720 may include the interconnection wire 722 that extends in the in-plane direction of the first surface 110 of the through electrode substrate 10. The interconnection wire 722 may have a width w1 that is greater than a diameter dc of the through-hole 15 on the first surface 110.

Nineteenth Embodiment

Figure 43A:
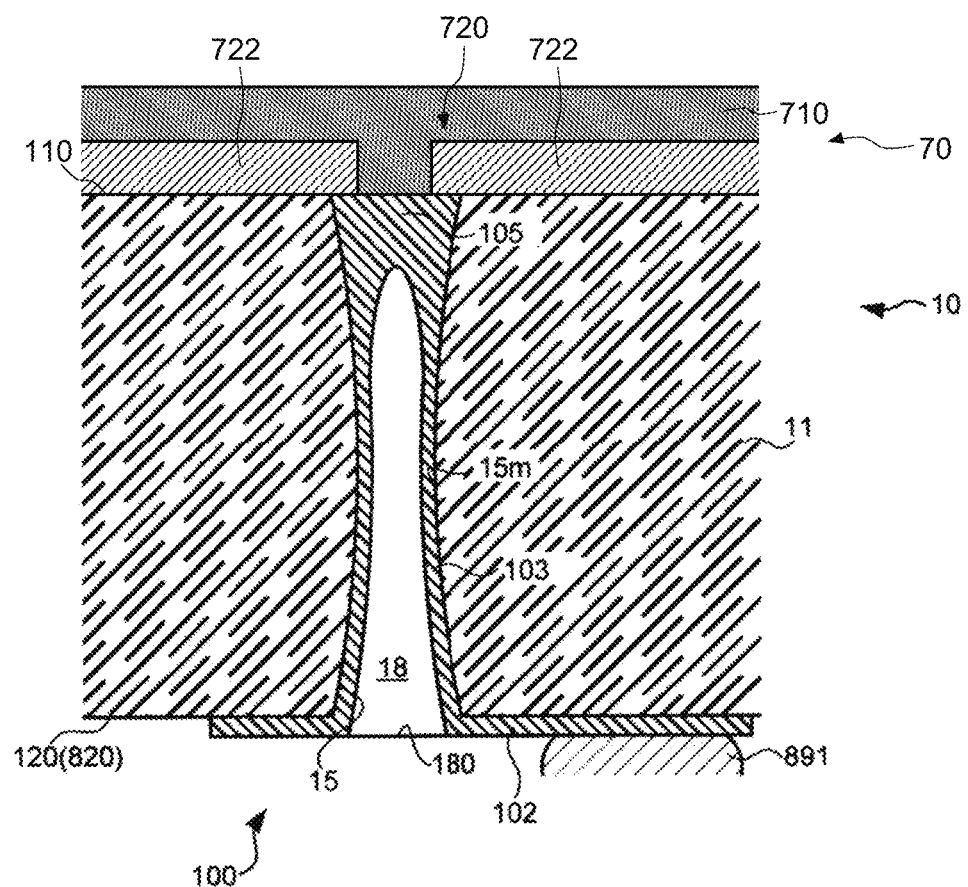
FIG. 43A illustrates an example of a sectional structure of a wiring layer connected to a closure portion of a through electrode substrate.
Figure 43B:
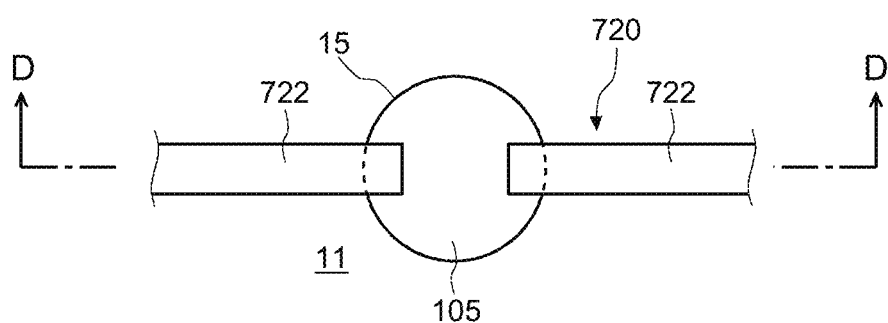
FIG. 43B is a plan view of the wiring layer illustrated in FIG. 43A.

In the nineteenth embodiment, an example of a sectional structure of a wiring layer 720 connected to the closure portion 105 of the through electrode substrate 10 is described with reference to FIGS. 43A and 43B. FIG. 43A is a sectional view of the wiring layer. FIG. 43B is a plan view of the wiring layer. FIG. 43A is a sectional view of the wiring layer taken along line D-D of FIG. 43B.

As illustrated in FIGS. 43A and 43B, the wiring layer 720 may include the interconnection wire 722 that is connected to the closure portion 105 and that extends in the in-plane direction of the first surface 110. For example, the wiring layer 720 may include a plurality of interconnection wires 722 that are connected to the closure portion 105 and that extend in directions different from each other.

While the embodiments of the present invention has been described above, the above-described embodiments can be applied by combining one another or replacing each other. In addition, each of the above-described embodiments can be modified and implemented as described below. For example, even when a through electrode is formed in the through-hole 15A without the minimum portion 15m, such as the through electrode 100A according to the fourth embodiment (FIG. 19), a through electrode substrate can be manufactured by the method described in the first, second, or third embodiment.

REFERENCE SIGNS LIST 10 through electrode substrate, 11 glass substrate, 15, 15A, 15E through-hole, 15m minimum portion, 16 first end, 17 second end, 18, 18A, 18E space, 50 wiring structure portion, 70, 70C wiring laminate, 80, 80C wiring substrate, 91 printed wiring board, 92, 93 electronic device, 100, 100A, 100C, 100D, 100E through electrode, 100a first metal layer, 100b second metal layer, 100c third metal layer, 102, 102A pad portion, 103, 103A through portion, 105, 105A closure portion, 109, 109C, 109D filler, 110, 810, 910 first surface, 120, 820, 920 second surface, 150E bottomed hole, 180, 180A, 180E opening, 500 smartphone, 600 notebook personal computer, 710 insulating interlayer, 720, 720C wiring layer, 811, 911, 921, 922, 923 electrode, 891, 892, 893 bump, 1000 electronic unit, 1100 control unit

The invention claimed is:

1. A through electrode substrate comprising:
   a substrate having a first surface, a second surface, and a through-hole that penetrates between the first surface and the second surface; and
   a through electrode disposed inside of the through-hole, wherein the through electrode includes a first portion that closes part of the through-hole adjacent to the first surface and a second portion disposed along an internal surface of the through-hole,
   wherein a thinnest part of the first portion in a direction perpendicular to the first surface has a thickness of A, a thinnest part of the second portion has a thickness of B, and a diameter of the through-hole on the first surface has a length of C, and
   wherein a relationship $A<C<A+B\times 2$ is satisfied.

2. The through electrode substrate according to claim 1, wherein the
   first portion includes a part having a thickness that increases as a distance from a central axis of the through-hole increases.

3. The through electrode substrate according to claim 1, wherein when viewed in a cross section including
   a central axis of the through-hole, an inner surface of the first portion located inside the through-hole has a largest curvature at a thinnest part of the first portion.

4. The through electrode substrate according to claim 1, wherein a thinnest part of the first portion is located at a position corresponding to a central axis of the through-hole.

5. The through electrode substrate according to claim 1, wherein the through-hole has a minimum portion in which a diameter of the through-hole has a smallest value,
   wherein the minimum portion is located between the first surface and the second surface, and
   wherein the through electrode does not close the through-hole at the minimum portion.

6. The through electrode substrate according to claim 1, further comprising:
a wiring layer disposed adjacent to the first surface of the substrate, the wiring layer being in contact with the through electrode,
wherein when viewed in the direction perpendicular to the first surface, a contact region in which the wiring layer is in contact with the through electrode overlaps the through-hole.

7. The through electrode substrate according to claim 6, wherein when viewed in the direction perpendicular to the first surface, the contact region is surrounded by an outer edge of the through-hole on the first surface.

8. The through electrode substrate according to claim 6, wherein when viewed in the direction perpendicular to the first surface, the contact region overlaps an outer edge of the through-hole on the first surface.

9. The through electrode substrate according to claim 6, wherein the contact region includes a plurality of regions.

10. The through electrode substrate according to claim 1, wherein a surface of the first portion adjacent to the first surface is located inside the through-hole.

11. The through electrode substrate according to claim 1, further comprising:
a filler located inside the through-hole, the filler being positioned in a portion of the through electrode other than a metal layer.

12. The through electrode substrate according to claim 11, wherein the filler contains a material having electrical conductivity.

13. The through electrode substrate according to claim 12, further comprising:
a second wiring layer disposed adjacent to the second surface of the substrate, the wiring layer being in contact with the filler,
wherein when viewed in a direction perpendicular to the second surface, a contact region in which the second wiring layer is in contact with the filler is surrounded by an outer edge of the through-hole on the second surface.

14. The through electrode substrate according to claim 11, wherein the filler contains a material having electrical insulation properties.

15. The through electrode substrate according to claim 1, wherein when viewed in a cross section including a central axis of the through-hole, a surface of the first portion located inside the through-hole has a radius of curvature ra at a thinnest part of the first portion,
wherein a radius of the through-hole on the first surface has a length of rb, and
wherein a relationship ra/rb≥0.2 is satisfied.

16. An electronic unit comprising:
the through electrode substrate according to claim 1; and
an electronic device electrically connected to the through electrode of the through electrode substrate.

17. The electronic unit according to claim 16, wherein the electronic device includes an electrode electrically connected to the through electrode, and
wherein when viewed in the direction perpendicular to the first surface of the through electrode substrate, the electrode of the electronic device overlaps the through electrode.

18. A method for manufacturing the electronic unit according to claim 17, comprising:
electrically connecting the through electrode to the electrode by heating the electronic device with pressure directed to the through electrode substrate being applied to the electronic device.

19. A method for manufacturing a through electrode substrate, comprising:
forming, in a substrate having a first surface to a second surface and a through-hole that penetrates between the first surface and the second surface, a seed layer extending along the first surface, an internal surface of the through-hole and the second surface;
forming an electroplated layer on the seed layer by an electroplating process under a first condition so that the electroplated layer has a thickness that does not close the through-hole;
further forming the electroplated layer by an electroplating process under a second condition that a growth rate of the electroplated layer on the seed layer on the first surface is higher than a growth rate of the electroplated layer on the seed layer on the second surface so that part of the through-hole adjacent to the first surface is closed;
pouring a fluid into the through-hole from the second surface side; and
forming, by solidifying the fluid, a filler with which the through-hole other than the electroplated layer is filled.

20. A through electrode substrate comprising:
a substrate having a first surface, a second surface, and a through-hole that penetrates between the first surface and the second surface; and
a through electrode disposed inside of the through-hole,
wherein the through electrode includes a first portion that closes part of the through-hole adjacent to the first surface and a second portion disposed along an internal surface of the through-hole,
wherein the first portion includes a part having a thickness in a direction perpendicular to the first surface that increases as a distance from a central axis of the through-hole increases,
wherein the second portion extends continuously from the first portion to the second surface along the internal surface of the through-hole, and
wherein the first portion include an outer surface that is flush with the first surface.

* * * * *